(12) United States Patent
Kuroda

(10) Patent No.: US 6,857,838 B2
(45) Date of Patent: Feb. 22, 2005

(54) SUBSTRATE PROCESSING SYSTEM WITH POSITIONING DEVICE AND SUBSTRATE POSITIONING METHOD

(75) Inventor: Osamu Kuroda, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/395,129

(22) Filed: Mar. 25, 2003

(65) Prior Publication Data

US 2003/0180127 A1 Sep. 25, 2003

(30) Foreign Application Priority Data

Mar. 25, 2002 (JP) ........................................ 2002-082599

(51) Int. Cl.[7] .............................................. B65G 1/00
(52) U.S. Cl. .................... 414/333.01; 414/935; 198/394
(58) Field of Search ........................... 414/333.01, 455, 414/454, 935, 936, 459; 198/394, 401

(56) References Cited

U.S. PATENT DOCUMENTS

| | | | | |
|---|---|---|---|---|
| 4,685,206 A | * | 8/1987 | Kobayashi et al. | ......... 414/754 |
| 4,770,600 A | * | 9/1988 | Ishikawa | ..................... 198/394 |
| 4,887,904 A | * | 12/1989 | Nakazato et al. | ........... 198/394 |
| 6,309,163 B1 | * | 10/2001 | Nering | ................... 414/331.01 |
| 6,485,248 B1 | * | 11/2002 | Taylor, Jr. | .............. 414/331.01 |
| 6,524,051 B2 | * | 2/2003 | Nering | .................. 414/331.01 |

FOREIGN PATENT DOCUMENTS

JP        2000-21956        1/2000

* cited by examiner

Primary Examiner—James R. Bidwell
(74) Attorney, Agent, or Firm—Smith, Gambrell & Russell, LLP

(57) ABSTRACT

A substrate processing system includes a notch aligner. The notch aligner includes a rotating support device, a servomotor for rotating the rotating support device, a sensor for detecting a notch formed in a wafer, a wafer lifting device, a cylinder actuator for vertically moving the wafer lifting device, and a CPU. The rotating support device holds a wafer in a horizontal position. The sensor detects the notch to determine the orientation of the wafer. The wafer lifting device receives the wafer from the rotating support device and lifts up the wafer from the rotating support device. A notch detection signal provided by the sensor is given to the CPU. The CPU gives control signals to the servomotor and the pneumatic cylinder actuator to operate the servomotor and the cylinder actuator so that the wafer is aligned.

12 Claims, 18 Drawing Sheets

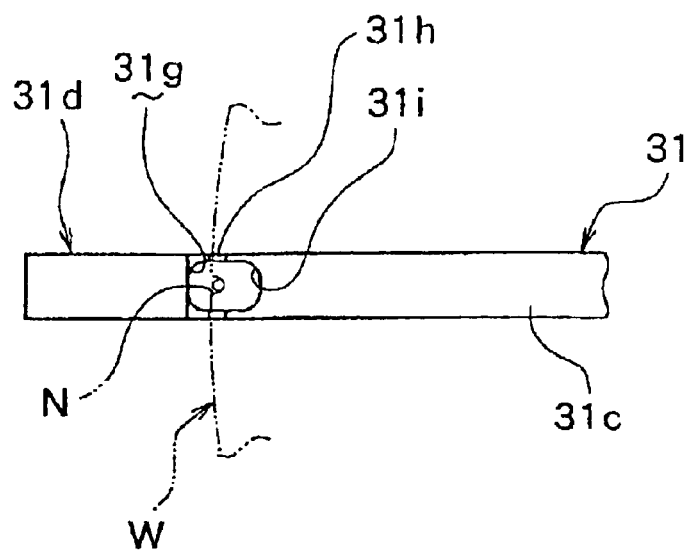
F I G. 7A
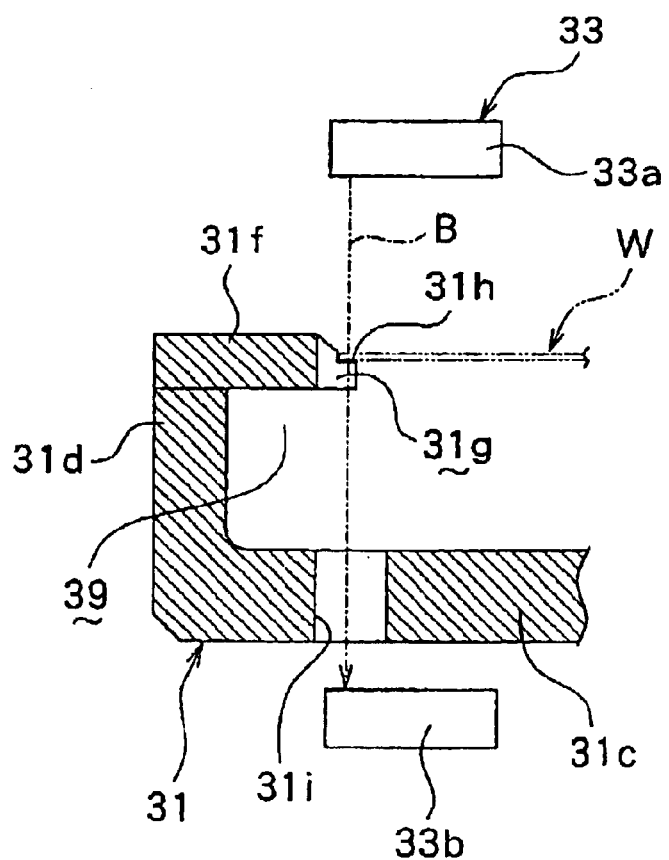
F I G. 7B

SUBSTRATE PROCESSING SYSTEM WITH POSITIONING DEVICE AND SUBSTRATE POSITIONING METHOD

BACKGROUND OF THE INVENTION

1. Field of the Invention

The present invention relates to a substrate processing system for processing a substrate, such as a semiconductor wafer or a glass substrate for an LCD and, more particularly, to a substrate positioning unit included in a substrate processing system and. This invention further relates to a substrate positioning method.

2. Description of the Related Art

Generally a known semiconductor device fabricating process includes a step of coating a surface of a substrate, such as a semiconductor wafer, with a photoresist film, and a step of removing the photoresist film from the substrate. In those steps, a wafer is placed in a substrate processing unit in proper alignment relative to the substrate processing unit. The wafer is provided with a U-shaped or V-shaped alignment notch in its circumference. A substrate positioning unit generally called a notch aligner aligns the notch to a designated angle. The wafer thus aligned is carried into the substrate processing unit, such as a cleaning unit. The cleaning unit removes resist films and metal particles from the surfaces and the edge of the wafer, and dries the thus cleaned wafer.

Generally, a conventional notch aligner holds a wafer on an O ring placed on a rotating stage by suction, and rotates the wafer together with the rotating stage. Since the O-ring is in contact with the back surface of the wafer, it is possible that the wafer is contaminated with particles.

A prior art notch aligner disclosed in JP 2000-21956A supports a wafer by its periphery and detects an alignment notch formed in the circumference of the wafer. This prior art notch aligner is provided with a drop-in type rotating stage and a stationary stage. The rotating stage and the stationary stage each have three supporting parts on which a peripheral part of a wafer rests. The supporting parts are formed in outer end parts of narrow, radial arms radially extending from the centers of the rotating stage and the stationary stage, respectively. The arms of each of the rotating stage and the stationary stage are arranged at angular intervals of 120°. The rotating stage starts rotating from a predetermined reference angular position to determine the position of the alignment notch of a wafer supported thereon. When the position of the alignment notch could not be determined during the rotation of the rotating stage, the stationary stage receives the wafer from the rotating stage, turns through a predetermined angle, and then transfers the wafer to the rotating stage. Then, the rotating stage starts rotating from the reference angular position. Both the rotating stage and the stationary stage of the prior art notch aligner are rotatable, and the rotating stage can be vertically moved. Therefore, the prior art notch aligner has is large and has complicated construction. There is the possibility that the prior art notch aligner produces many particles because the same has many moving parts including rotating parts and vertically moving parts.

A holding member holds a wafer by its peripheral part in cleaning the wafer by using a spin chuck. A cleaning liquid has a difficulty in wetting parts, in contact with the holding member, of the wafer, so that it is possible that the parts in contact with the holding member cannot be satisfactorily cleaned. A spin chuck provided with a holding member that is operated by centrifugal force has been proposed to solve such a problem. The center of gravity of the holding member of this previously proposed spin chuck is determined properly such that the holding member does not hold the wafer while the spin chuck rotates for cleaning at a comparatively low rotating speed. However, when only a desired peripheral part of a wafer needs to be cleaned by using the spin chuck, the desired peripheral part cannot accurately be cleaned due to the eccentricity of the wafer.

SUMMARY OF THE INVENTION

The present invention has been made in view of the foregoing problems and it is therefore an object of the present invention to provide a substrate processing system with a small alignment device (positioning device) having simple construction and capable of operating without producing unacceptably many particles. A further object of the present invention is to provide a substrate positioning method that can be carried out by using a small alignment device (positioning device) having simple construction, and that can be performed without producing unacceptably many particles.

According to the first aspect of the present invention, a substrate processing system including: a substrate processing unit that performs a predetermined process to process a substrate; and an aligner that aligns a cut-away portion formed in a peripheral portion of the substrate to be processed by the substrate processing unit to a designated angle; wherein the aligner includes: a first support device adapted to hold a substrate in a horizontal position at a first level; a first actuator adapted to rotate the first support device about a vertical axis; a sensor adapted to detect the cut-away portion of the substrate supported on the first support device; a controller configured to control operations of the first actuator for driving the first support device for rotation, and to control the first actuator so that the first support device supporting the substrate is stopped at a predetermined angular position when the cut-away portion is detected; a second support device adapted to lift up the substrate supported on the first support device stopped at the predetermined angular position to a second level higher than the first level, and a second actuator adapted to vertically move the second support device.

Preferably, the first support device is configured to be incapable of vertical movement, and the second support device is configured to be incapable of rotation.

In one preferred embodiment, the substrate processing system further includes: a receiving/delivering section adapted to receive the substrates to be processed by the substrate processing unit and to deliver the substrate processed by the substrate processing unit; a first substrate conveyer adapted to carry the substrate between the receiving/delivering section and the aligner; and a second substrate conveyer adapted to carry the substrate between the aligner and the substrate processing unit.

In another preferred embodiment, the substrate processing system further includes: a substrate conveyer adapted to carry the substrate, having been aligned by the aligner, from the aligner, the conveyer having a substrate carrying arm, wherein: the first support device is configured so that the substrate carrying arm of the substrate conveyer can move below the substrate supported by the first support device without colliding with the first support device when the first support device is in a angular position within a first angular range; and the controller is configured to control operations of the first and the second actuators so that the second support device raises to receive the substrate from the first support device, thereafter the first support device rotates to be in a angular position within the first angular range, and thereafter the second support device lowers to deliver the substrate to the first support device, if the first support device is in an angular position within a second angular range in which the substrate carrying arm of the substrate conveyer collide with the first support device when the substrate carrying arm moves below the substrate supported by the first support device.

In this case, the angular position within the first angular range to which the first support device is to be positioned may be a home position, to which the first support device is positioned when the first support device receives the substrate to be aligned.

The controller may be configured to control operations of the first and the second actuators so that the second support device raises to receive the substrate from the first support device, thereafter the first support device rotates to be in the angular position within the first angular range, and thereafter the second support device lowers to deliver the substrate to the first support device, only when the first support device is in the angular position within the second angular range.

In a preferred embodiment, the sensor is an optical sensor having a light-emitting element and a light-receiving element, the light-emitting element being configured to vertically emit a light to a peripheral portion of the substrate supported on the first support device; the first support device has a plurality of support elements that support peripheral portions of the substrate thereon; and each of the support element is configured and sized so that the cut-away portion of the substrate does not entirely overlap with any one of the supporting elements, as viewed in a vertical direction.

In another preferred embodiment, the sensor is an optical sensor having a light-emitting element and a light-receiving element, the light-emitting element being configured to vertically emit a light to a peripheral portion of the substrate supported on the first support device; the first support device includes a plurality of support arms each having a first portion extending radially outwardly, a second portion rising from an outer end of the first portion, and third portion extending radially inwardly from an upper end of the second member and having and a bifurcated end on which the substrate is to be placed, the bifurcated end of each of the support arms comprises a pair of support elements arranged so that a gap is defined therebetween, the first portion of the support arm has a through hole (or slot), and the gap and the thorough hole is arranged and sized so that at least a part of the light emitted by the light-emitting element of the sensor is capable of passing through the through hole, the gap and the cut-away portion of the substrate, even if the substrate is supported on the first support member in such a manner that the cut-away portion of the substrate is located on or adjacent to the bifurcated end.

According to the second aspect of the present invention, a substrate positioning method is provided, which includes the steps of: (a) placing a substrate on a first support device, which is in a home angular position; (b) detecting a cut-away portion formed in a peripheral portion of the substrate while rotating the first support member together with a substrate supported thereon; (c) stopping rotating the first support member to align the cut-away portion of the substrate to a designated angle based on a detection of the cut-away portion; (d) raising a second support device to transfer the substrate from the first support device to the second support device; (e) rotating the first support device to position the first support device in the home angular position; (f) lowering the second support device to transfer the substrate from the second support device to the first support device; and (g) removing the substrate from the first support device.

The step (a) may be performed by a first substrate conveyer, and the step (g) may be performed by a second substrate conveyer.

The substrate to be placed on the first support device in the step (a) may be delivered from a receiving/delivering section of a substrate processing system, and the substrate removed from the first support device in the step (g) may be conveyed to a processing unit of the substrate processing system.

The present invention further provides a substrate positioning method, which includes the steps of: (a) placing a substrate on a first support device; (b) detecting a cut-away portion formed in a peripheral portion of the substrate while rotating the first support member together with a substrate supported thereon; (c) stopping rotating the substrate to align the cut-away portion of the substrate to a designated angle based on a detection of the cut-away portion; (d) judging whether or not a substrate carrying arm of a substrate conveyer collide with the first support device, when the substrate carrying arm is moved into a space below the substrate supported by the first support device; (e) performing, if it is judged in the step (d) that the arm of the substrate conveyer does not collide with the first support device, the steps of: (e-i) moving the arm of the substrate conveyer into the space below the substrate supported by the first support device; and (e-ii) raising the arm of the substrate conveyer to remove the substrate from the first support device, and (f) performing, if it is judged in the step (d) that the arm of the substrate conveyer collides with the first support device, the steps of: (f-i) raising a second support device to transfer the substrate from the first support device to the second support device; (f-ii) rotating the first support device to locate the first support device in an angular position in which the first support device does not collide with the substrate carrying arm of the substrate conveyer; (f-iii) lowering the second support device to transfer the substrate from the second support device to the first support device; (f-iv) moving the arm of the substrate conveyer into the space below the substrate supported by the first support device; and(f-v) raising the arm of the substrate conveyer to remove the substrate from the first support device.

BRIEF DESCRIPTION OF THE DRAWINGS

FIGS. 7A and 7B are an enlarged plan view and an enlarged sectional view, respectively, of a sensing unit included in the notch aligner shown in FIG. 3;

DESCRIPTION OF THE PREFERRED EMBODIMENTS

Preferred embodiments of the present invention will be described with reference to the accompanying drawings.

Figure 1:
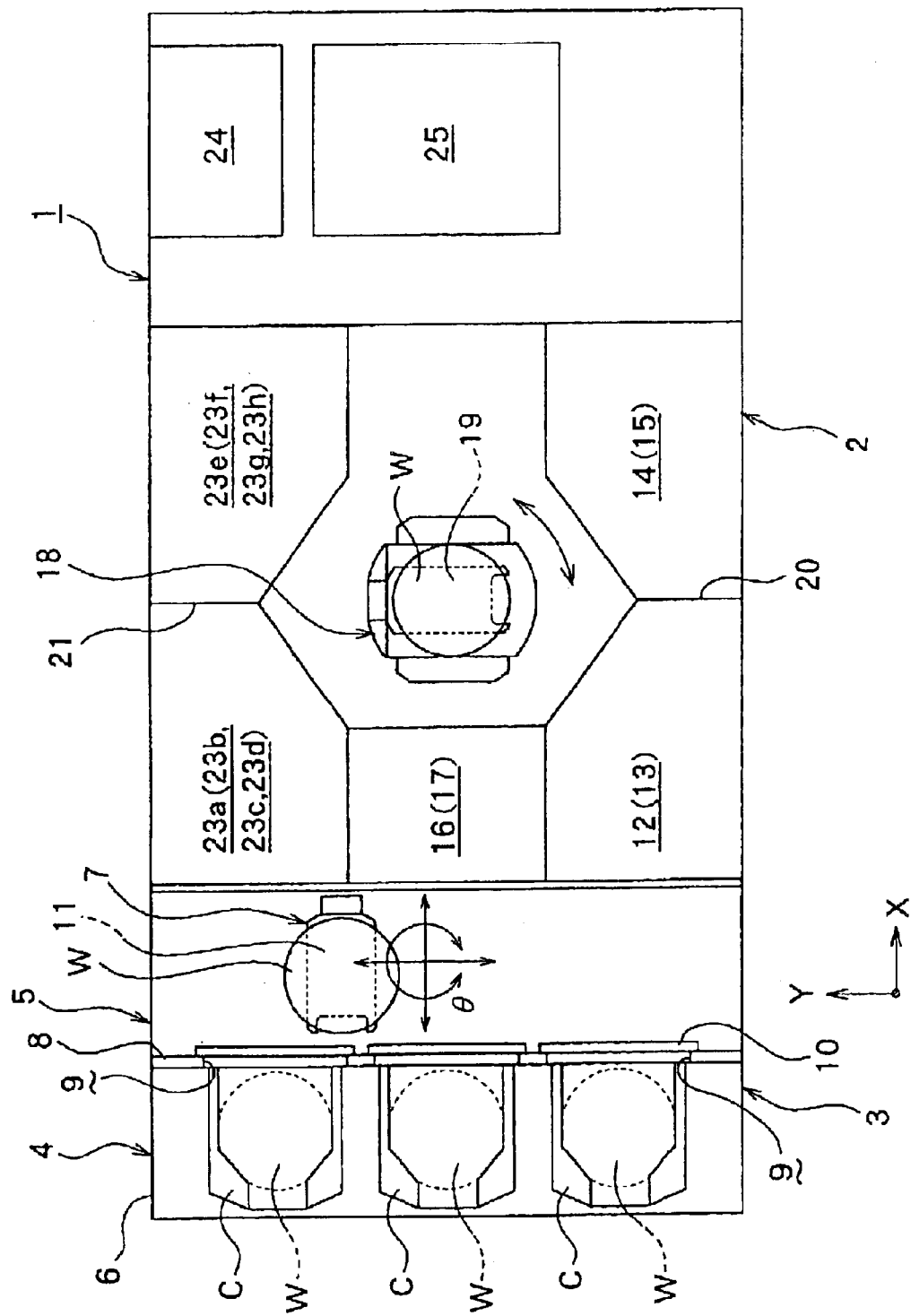
FIG. 1 is a schematic plan view of a semiconductor wafer processing system, i.e., a substrate processing system, in a preferred embodiment according to the present invention.
Figure 2:
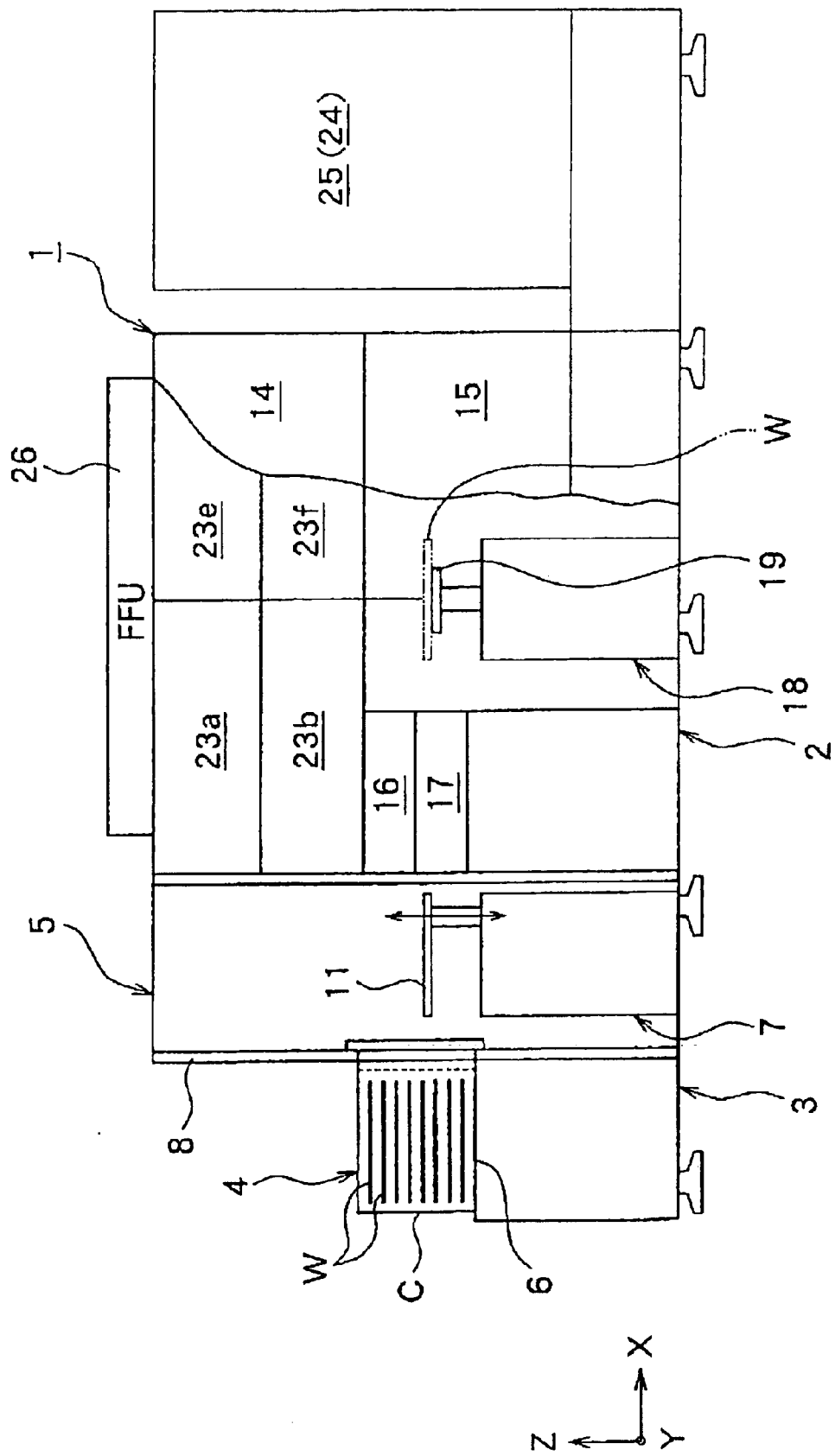
FIG. 2 is a schematic side elevation of the semiconductor wafer processing system shown in FIG. 1.

A substrate processing system 1 in a preferred embodiment according to the present invention will be described as applied to a substrate processing system for carrying out a resist film removing process for removing a resist film from the surface of a wafer and a cleaning process for cleaning the wafer. FIG. 1 is a schematic plan view of the substrate processing system 1 having a plurality of substrate processing units, and FIG. 2 is a schematic side elevation of the substrate processing system 1. The substrate processing system 1 includes, as principal components, a substrate processing section 2 for processing workpieces, such as semiconductor wafers W (hereinafter referred to simply as "wafers W"), and a receiving/delivering section 3 for receiving wafers W, carrying wafers W into the substrate processing section 2 and delivering processed wafers W.

The receiving/delivering section 3 has an in/out port 4 including wafer carriers C each capable of holding, for example, twenty-five processed or unprocessed wafers W, a table 6 for supporting the wafer carriers C thereon, and a wafer carrying unit 5 including a wafer conveyer 7, i.e., a first substrate carrying means, for transferring wafers W from the wafer carrier C placed on the table 6 to the substrate processing section 2 and vice versa.

The wafer carrier C has one side provided with an opening covered with a cover. The wafers W held in the wafer carrier C are accessible when the cover is opened. Shelves are supported on the inner surfaces of walls of the wafer carrier C to support wafers W at predetermined intervals. The shelves define twenty-five slots for accommodating wafers W. One wafer W is inserted in each of the slots with its major surface on which semiconductor devices are to be formed facing up.

A plurality of wafer carriers C, for example, three wafer carriers C, can be arranged horizontally along the Y-axis on the table 6 of the in/out port 4. The wafer carrier C is placed on the table 6 with its side provided with the cover faced toward a partition wall 8 separating the in/out port 4 and the waver carrying unit 5. Windows 9 are formed in the partition wall 8 at positions corresponding to positions where the wafer carriers C are placed on the table 6. The windows 9 are closed by shutters 10 installed on the side of the wafer carrying unit 5 with respect to the windows 9.

The wafer conveyer 7 placed in the wafer carrying unit 5 is horizontally movable along the Y-axis, is vertically movable along the Z-axis, and is turnable in the θ-direction in a horizontal plane, i.e., XY-plane. The wafer conveyer 7 has a wafer carrying arm 11 capable of holding and carrying a wafer W. The wafer carrying arm 11 is horizontally movable along the X-axis. Thus, the wafer conveyer 7 is capable of accessing every one of the slots, at different levels, of the wafer carrier C placed on the table 6 and each of two vertically arranged wafer delivery units 16 and 17, and of transferring the wafer from the in/out port 4 to the substrate processing section 2 and vice versa.

The substrate processing section 2 includes a main wafer conveyer 18, i.e., a second substrate conveyer, the wafer delivery units 16 and 17, four substrate cleaning units 12, 13, 14 and 15, and substrate processing units 23a to 23h. The wafer delivery units 16 and 17 hold wafers W temporarily, thus they function as wafer relay units. The two substrate cleaning units 12 and 13 are stacked and the two substrate cleaning units 14 and 15 are stacked. A wall 20 separates the two substrate cleaning units 12 and 13, and the two substrate cleaning units 14 and 15. The four substrate processing units 23a to 23d are stacked, and the four substrate processing units 23e to 23h are stacked. A wall 21 separates the four substrate processing units 23a to 23d, and the four substrate processing units 23e to 23h. It should be noted that although the units 12-15 and the units 23a to 23h have different names (the former being "cleaning" units, the latter being "processing" units), the term "substrate processing unit" means that it includes "substrate cleaning unit".

The substrate processing section 2 has an ozone generator 24 that generates ozone gas, i.e., a processing gas, and a chemical liquid storage unit 25 for storing a processing liquid to be supplied to the substrate cleaning units 12 to 15. A fan filter unit (FFU) 26 is installed on the top wall of the substrate processing section 2 to supply clean air to those units and the main wafer conveyer 18.

Part of clean air blown downward by the FFU 26 flows through the wafer transfer units 16 and 17, a space extending over the wafer transfer units 16 and 17 into the wafer carrying unit 5. Thus, contaminants, such as foreign particles, are prevented from migrating from the wafer carrying unit 5 into the substrate processing section 2 to maintain the interior of the substrate processing section 2 clean.

The wafer transfer units 16 and 17, i.e., wafer relay units, for temporarily holding wafers W are stacked vertically. The lower wafer transfer unit 17 is used for temporarily holding a wafer W when the wafer W is transferred from the in/out port 4 to the substrate processing section 2. The upper wafer transfer unit 16 is used for temporarily holding a wafer W when the wafer W is transferred from the substrate processing section 2 to the in/out port 4. The lower wafer transfer unit 17 is provided with a notch aligner 30 according to the present invention.

Referring to FIGS. 3 to 8, the notch aligner 30 includes, as principal components, a rotating support device 31, i.e., a first support device, a servomotor 32, a notch sensor 33, a wafer lifting device 34, i.e., a second support device, and a pneumatic cylinder actuator 35. The rotating support device 31 receives a wafer W from the wafer carrying arm 11 of the wafer conveyer 7, supports the wafer W horizontally and rotates the wafer W in a horizontal plane. The rotating support device 31 is configured so that it is incapable of vertical movement. The servomotor 32 drives the rotating support device 31 for rotation in opposite directions, i.e., the normal and the reverse direction. The sensor 33 detects a notch N formed in the circumference of the wafer W supported on the rotating support device 31 to determine the orientation of the wafer W. The wafer lifting device 34 receives the wafer W from the rotating support device 31 and lifts up the wafer from the rotating support device 31. The wafer lifting device 34 is configured so that it is incapable of rotation. The pneumatic cylinder actuator 35 moves the wafer lifting device 34 vertically.

A notch detection signal provided by the sensor 33 is given to a central processing unit (hereinafter abbreviated to "CPU") 36, i.e., a controller. The CPU 36 gives control signals to the servomotor 32 and the pneumatic cylinder actuator 35 to operate (control) the servomotor 32 and the pneumatic cylinder actuator 35.

The rotating support device 31 has a hollow shaft 31a, a circular flange 31b joined to the upper end of the hollow shaft 31a, and four radial turning arms 31c formed integrally with the circular flange 31b, radially extending from the circumference of the circular flange 31b in a symmetrical arrangement and having rotating support parts 31d rising from the outer ends thereof, respectively. A peripheral part of the wafer W is seated on the rotating support parts 31d.

The hollow shaft 31a is supported for rotation on a cylindrical support member 38a by radial bearings 38. The support member 38a is mounted on a fixed base plate 37 coaxially with an opening 37a formed in the fixed base plate 37. A driven pulley 31e is mounted on the hollow shaft 31a, a drive pulley 32b is mounted on the drive shaft 32a of the servomotor 32, and a timing belt is extended between the driven pulley 31e and the drive pulley 32b. Thus, the servomotor 32 is able to drive the hollow shaft 31a for rotation in opposite directions through the drive pulley 32b, the timing belt 32c and the driven pulley 31e. The rotating support device 31 is turned through an angle of 360° in the normal direction from an initial position where the wafer carrying arm 11 places a wafer W on the rotating support device 31, and then the rotating support device 31 is turned in the reverse direction to the initial position.

Figure 3:
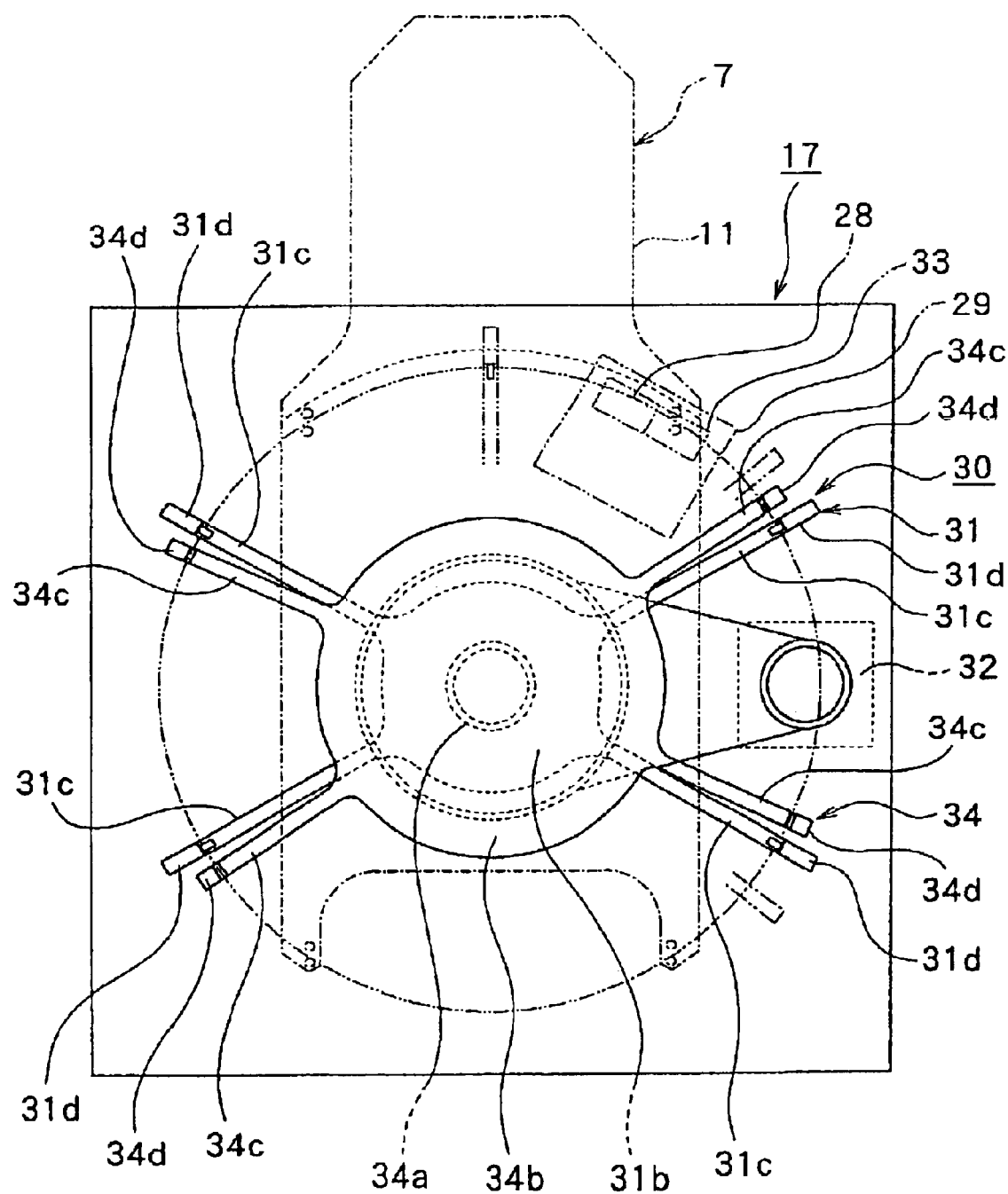
FIG. 3 is a schematic plan view of a wafer transfer unit and a notch aligner included in the semiconductor wafer processing system shown in FIG. 1.
Figure 8:
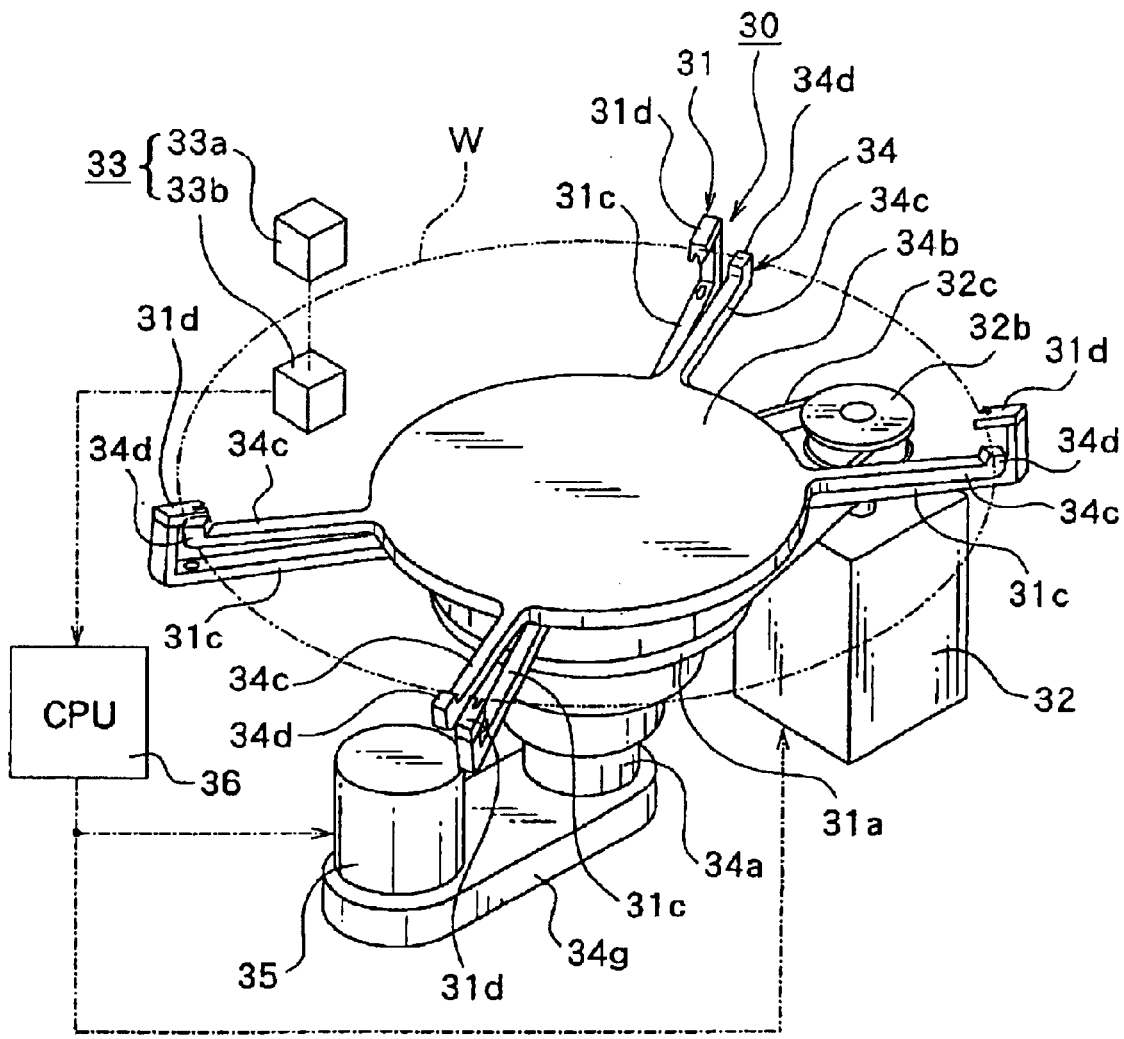
FIG. 8 is a perspective view of an essential part of the notch aligner shown in FIG. 3.
Figure 9:
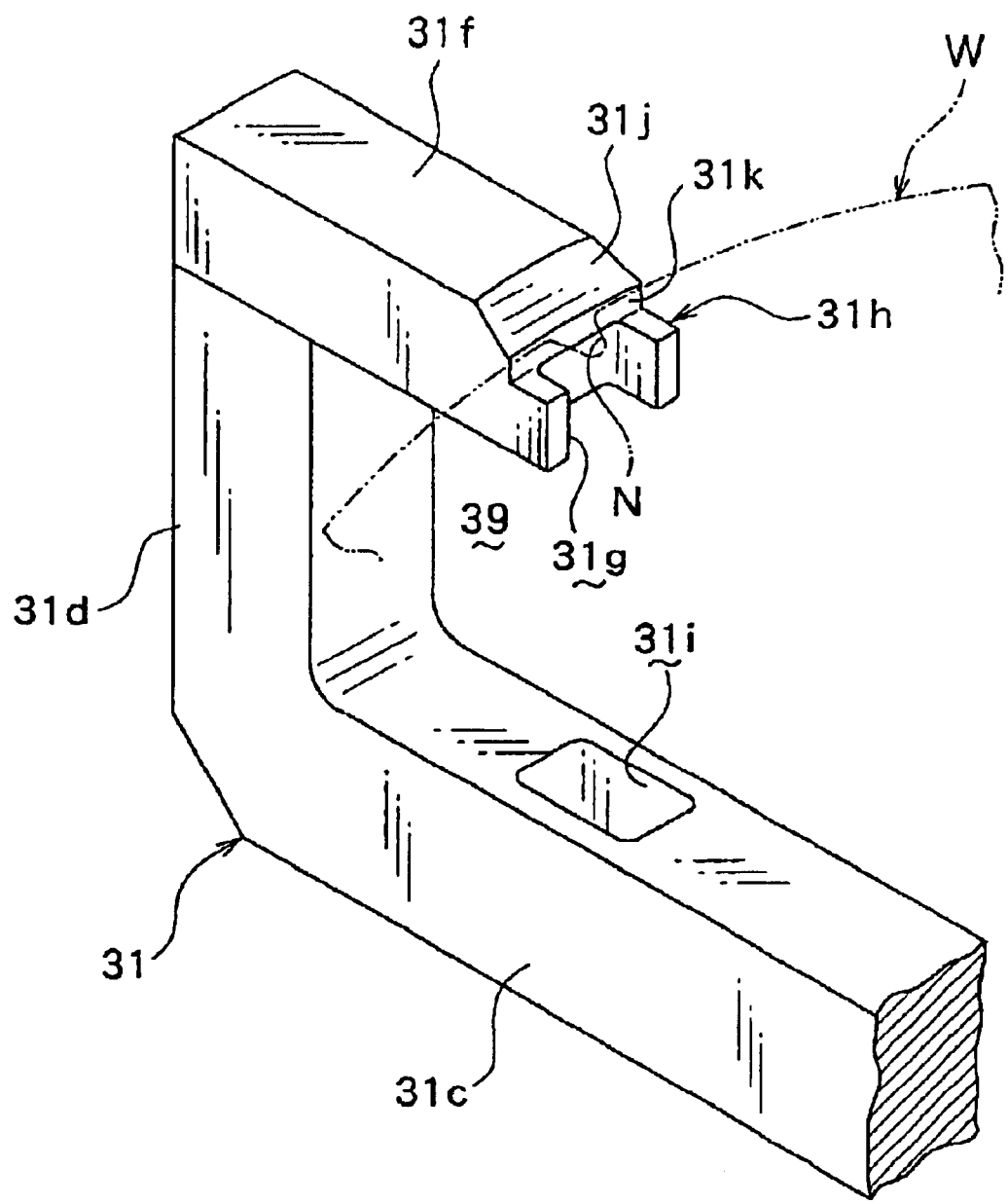
FIG. 9 is a perspective view of a rotating support device included in the notch aligner shown in FIG. 3.

Referring to FIGS. 3 and 8, the four radial turning arms 31c are divided into two sets each of the two radial turning arms 31c radially extending in opposite directions, respectively. The radial turning arms 31c of one of the sets and those of the other set are at angular intervals of an obtuse angle, such as 120°, to permit the wafer carrying arm 11 of the wafer conveyer 7 and a wafer carrying arm 19 included in the main wafer conveyer 18 to enter a space between the radial turning arms 31c of one of the sets and those of the other set. The rotating support part 31d rising from the outer ends of each radial turning arm 31c has a head 31f extending radially inward from its upper end and is formed in a shape resembling an inverted letter L. An inner end part of the head 31f is bifurcated to form a bifurcate support part 31h having a cut 31g. A slot 31i of a width equal to that of the cut 31g is formed in the radial turning arm 31c in a part directly below the cut 31g of the bifurcate support part 31h as shown in FIGS. 7A and 7B. As shown in FIG. 9, the bifurcate support part 31h has an inclined surface 31j sloping down toward the center of the rotating support device 31, and flat surfaces connected by a step 31k to the inclined surface 31j. A space 39 extends under the head 31f and the bifurcate support part 31h of the rotating support part 31d. The wafer carrying arm 11 and the wafer carrying arm 19 are able to move into, to move out of and to move vertically in the space 39.

Since the bifurcate support part 31h defining a cut 31g opening toward the center of the rotating support device 31 is formed in the rotating support part 31d rising from the outer end of each radial turning arm 31c, and the slot 31i of the width equal to that of the cut 31g is formed in the part directly below the cut 31g of the bifurcate support part 31h of each radial turning arm 31c, the sensor 33 is able to determine the orientation of the wafer W on the basis of the cuts 31g, the slots 31i and the notch N of the wafer W.

As sown in FIGS. 7 and 8, the sensor 33 is a photosensor having a light-emitting device 33a disposed above the wafer W supported on the rotating support device 31, and a light-receiving device 33b disposed below a peripheral part of the wafer W. As shown in FIG. 3, the sensor 33 is disposed on the side of the wafer conveyer 7 with respect to the rotating support device 31. The wafer carrying arm 11 advances toward the rotating support device 31 from that side and retracts away from the rotating support device 31 toward that side. The wafer carrying arm 11 places a wafer W on the rotating support device 31, and the rotating support device 31 supporting the wafer W rotates. The notch N of the wafer W is detected when a light beam B emitted by the light-emitting device 33a of the sensor 33 toward the light-receiving device 33b and traveled through the notch N, the cut 31g and the slot 31i falls on the light-receiving device 33b. Upon the reception of the light beam B, the light-receiving device 33b sends a notch detection signal to the CPU 36, and the CPU 36 provides a control signal to stop the operation of the servomotor 32 to align the wafer W. Although the sensor 33 is supposed to be the photosensor having the light-emitting device 33a disposed above the peripheral part of the wafer W supported on the rotating support device 31, and the light-receiving device disposed below the peripheral part of the wafer W in the foregoing description, the light-emitting device 33a and the light-receiving device 33b may be interchanged or the sensor 33 may be a reflex photosensor having a light-emitting device 33a and a light-receiving device 33b, which are disposed above or below the peripheral part of the wafer W supported on the rotating support device 31.

Preferably, the cuts 31g and the slots 31i are configured and sized so that the notch N of the wafer W does not entirely overlap with the arms 31c, as viewed in a vertical direction, regardless of angular positional relationship between the rotating support device 31 and the wafer W. Thus, at least a part of the light emitted from the light-emitting device 33a does not interrupted by the arms 31c, in the event that angular positional relationship between the rotating support device 31 and the wafer W are as shown in FIG. 9, or in the event that the bifurcate support part 31h is coincide with the notch N of the wafer W.

The wafer lifting device 34 includes a lifting shaft 34a vertically extended through a lower bearing member 38c attached to the lower surface of the fixed base plate 37 coaxially with the opening 37a of the fixed base plate 37, the cylindrical support member 38a and the hollow shaft 31a of the rotating support device 31 so as to be vertically movable, a circular plate 34b joined to the upper end of the lifting shaft 34a, and four radial lifting arms 34c formed integrally with the circular plate 34b, radially extending from the circumference of the circular plate 34b in a symmetrical arrangement and having lifting support parts 34d rising from the outer ends of the radial lifting arms 34c, respectively. A peripheral part of the wafer W supported on the rotating support device 31 is seated on the lifting support parts 34d when the lifting shaft 34a is raised. The lifting shaft 34a is supported for vertical movement in linear bearings 34f having balls arranged in endless guide grooves 34e formed in the inner surface of the lower bearing member 38c. A horizontal connecting plate 34g has one end joined to the lower end of the lifting shaft 34a and the other end connected to a piston rod 35a included in the pneumatic cylinder actuator 35 attached to the lower surface of the fixed base plate 37. The piston rod 35a is moved axially to move the lifting shaft 34a vertically.

Referring to FIGS. 3 and 8, the four radial lifting arms 34c are divided into two sets each of the two radial lifting arms 34c radially extending in opposite directions, respectively. The radial lifting arms 34c of one of the sets and those of the other set are at angular intervals of an obtuse angle, such as 120°. The radial lifting arms 34c are shifted by a small angle from positions corresponding to the radial turning arms 31c, respectively.

Figure 4:
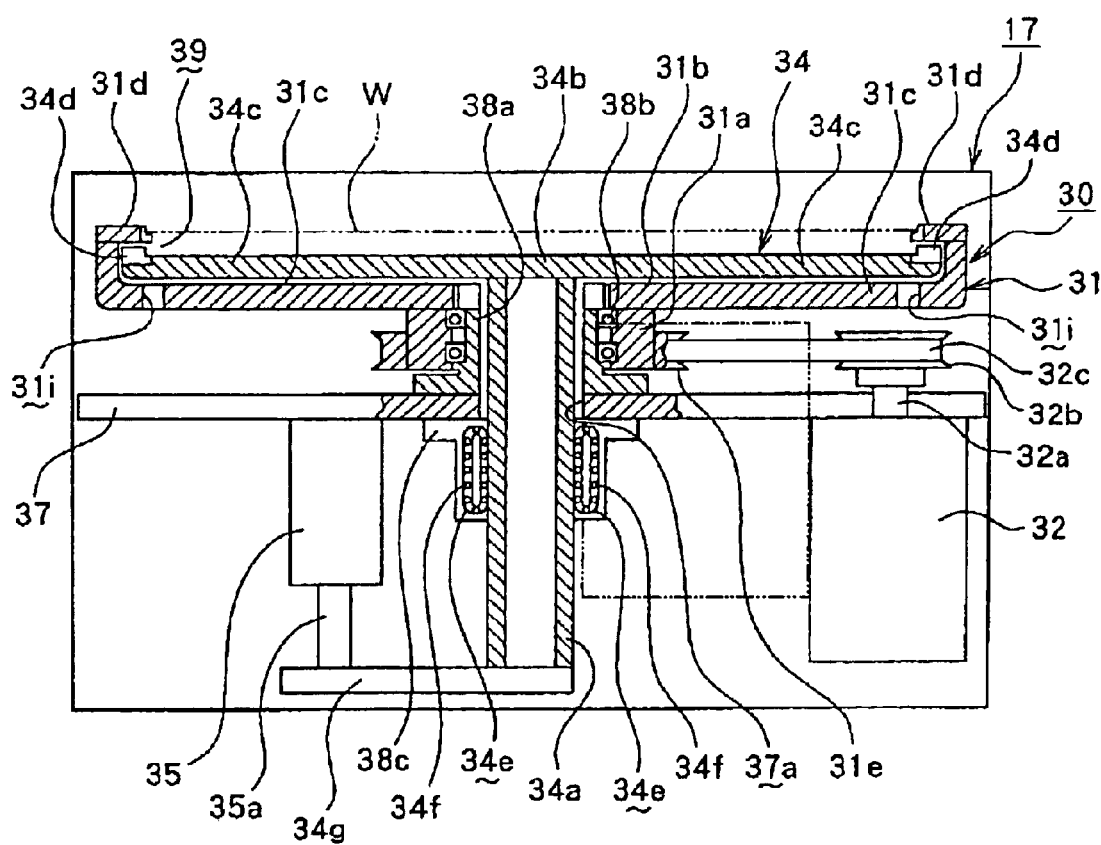
FIG. 4 is a sectional view of the notch aligner shown in FIG. 3 in a wafer receiving operation.

The wafer carrying arm 11 holding a wafer W moves to a position above the rotating support device 31 (which is in a home angular position as shown in FIG. 4) of the notch aligner 30, from the upper side of FIG. 4. Then the wafer carrying arm 11 descends to place the wafer W on the rotating support device 31 as shown in FIG. 4, and then is retracted from the position above the rotating support device 31. Subsequently, the servomotor 32 is actuated to rotate the wafer W in a horizontal plane together with the rotating support device 31. The sensor 33 gives a notch detection signal to the CPU 36 upon the detection of the notch N of the wafer W. Then, the CPU 36 gives a control signal to the servomotor 32 to stop the rotation of the rotating support device 31 such that the wafer W is aligned correctly. Information recorded in or indicated on a part of the lower surface of a peripheral part near the notch N can be read simultaneously with the detection of the notch N by an information reader 28 disposed beside the sensor 33 in a box 29 as indicated by two-dot chain lines in FIG. 3.

Figure 5:
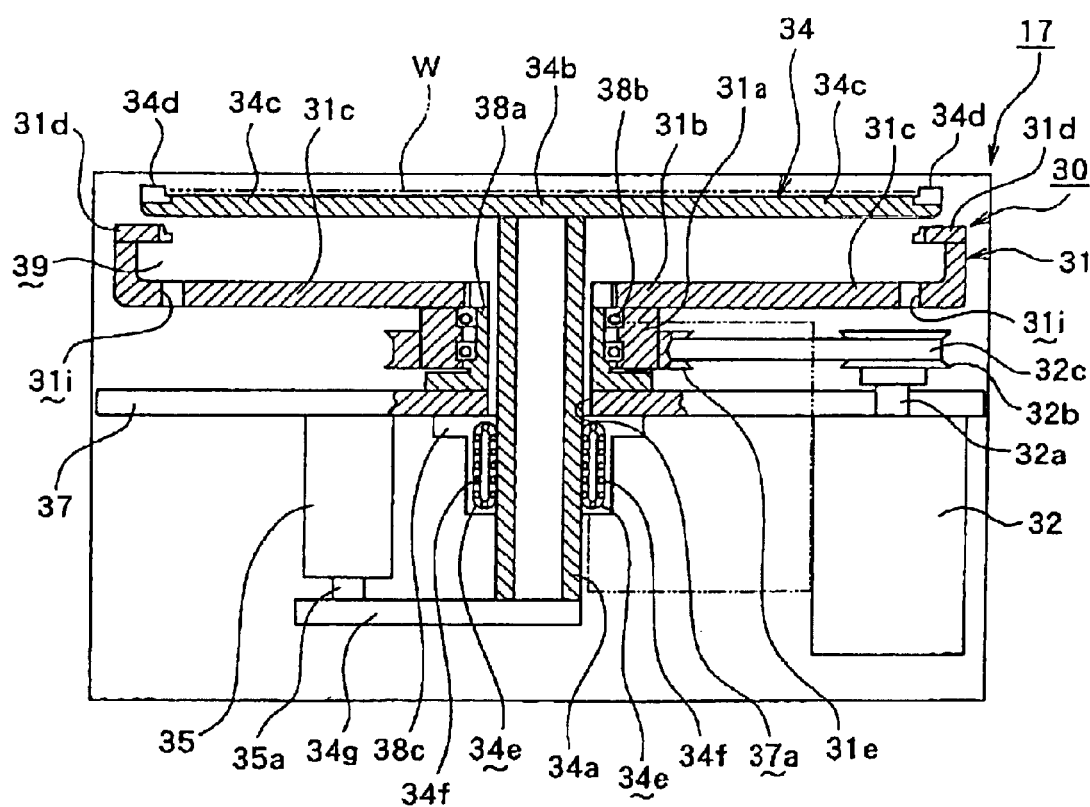
FIG. 5 is a sectional view of the notch aligner shown in FIG. 3 in a wafer lifting-up operation.
Figure 6:
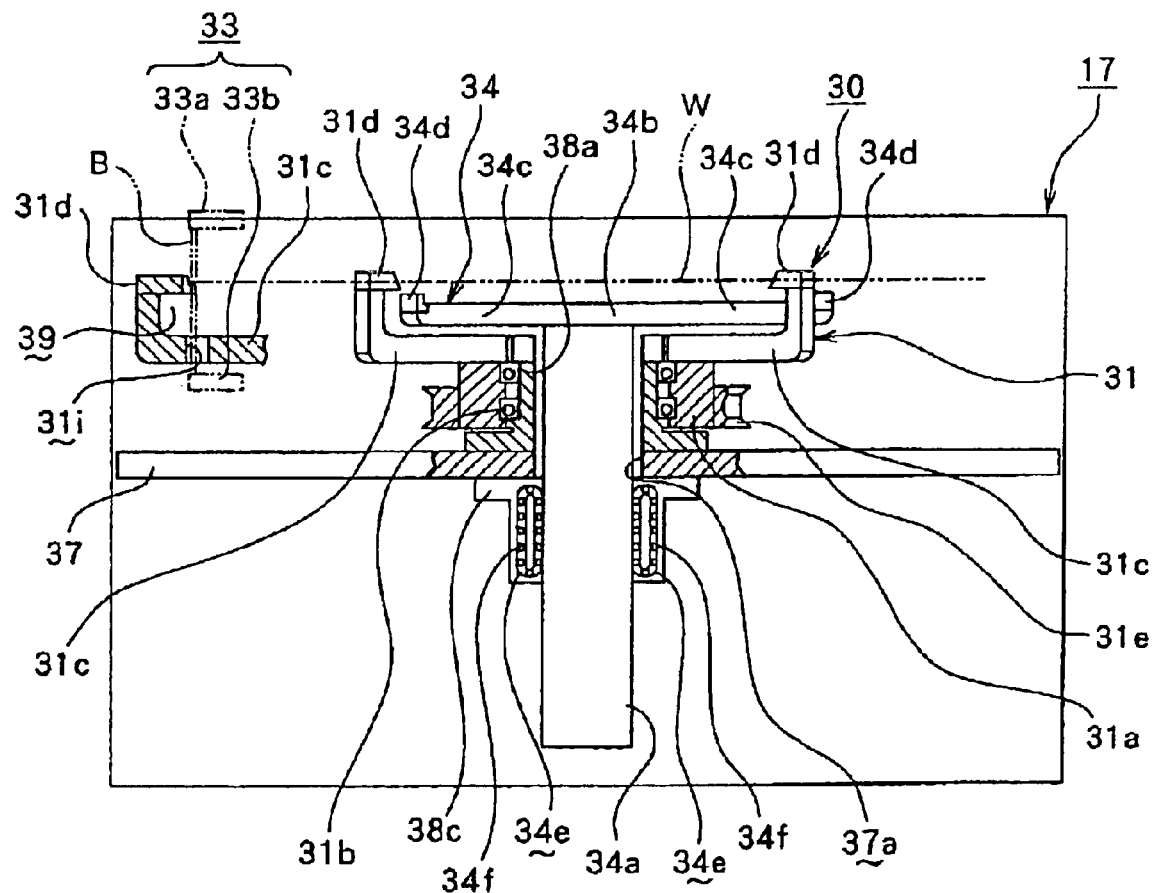
FIG. 6 is a sectional side elevation of the notch aligner shown in FIG. 3 in the wafer receiving operation.

Then, the pneumatic cylinder actuator 35 is actuated to retract the piston rod 35a. Consequently, the wafer lifting device 34 is raised to receive the wafer W from the rotating support device 31 and to lift up the wafer W to a position above the rotating support device 31 as shown in FIG. 5. Then, the servomotor 32 is reversed to return the rotating support device 31 to its initial position, and the wafer lifting device 34 is lowered to transfer the wafer W to the rotating support device 31 held at the initial position (i.e., home angular position). Thus, the wafer W is supported on the rotating support device 31 in a desired orientation.

Thereafter, a wafer carrying arm 19, described below in detail, of the main wafer conveyer 18 moves to a position below the wafer W from a lower side of FIG. 4. Then, the wafer carrying arm 19 raises to lift up the wafer W from the rotating support device 31, and delivers the wafer W to any one of the cleaning units 12–15.

The notch aligner 30 is able to set the wafer W in a desired orientation by driving the rotating support device 31 only for rotation and driving the wafer lifting device 34 only for vertical movement. Thus, the wafer W can be smoothly accurately aligned, and production of particles can be reduced to the lease unavoidable extent.

The CPU 36 controls the wafer lifting operation of the wafer lifting device 34 to lift up the wafer W only when the wafer carrying arm 19 and the rotating support device 31 interfere with each other, which improves throughput. Alternatively, the wafer lifting device 34 may lift up the wafer W every time.

The main wafer conveyer 18 is able to move in directions along the X-axis and the Z-axis and can be turned in the XY-plane (θ-direction) by a motor, not shown. The wafer carrying arm 19 of the main wafer conveyer 18 is able to slide in directions along the Y-axis. The main wafer conveyer 18 is capable of accessing the wafer conveyer 7 of the wafer carrying unit 5, the substrate cleaning units 12 to 15 and the substrate processing units 23a to 23h.

The substrate cleaning units 12, 13, 14 and 15 subject wafers W processed by a water-solubilizing process for water-solubilizing resist films by the substrate processing units 23a to 23h to a cleaning process and a drying process. The substrate cleaning units 12 to 15 are able to carry out a cleaning process using a cleaning chemical liquid and a subsequent drying process. The two substrate cleaning units 12 and 13 are capable of removing resist films from and cleaning the back surface and a peripheral part of the front surface of a wafer W (back-bevel cleaning process). The two substrate cleaning units 12 and 13 are the same in construction and hence only the substrate cleaning unit 12 will be described with reference to FIGS. 10 to 19.

Figure 10:
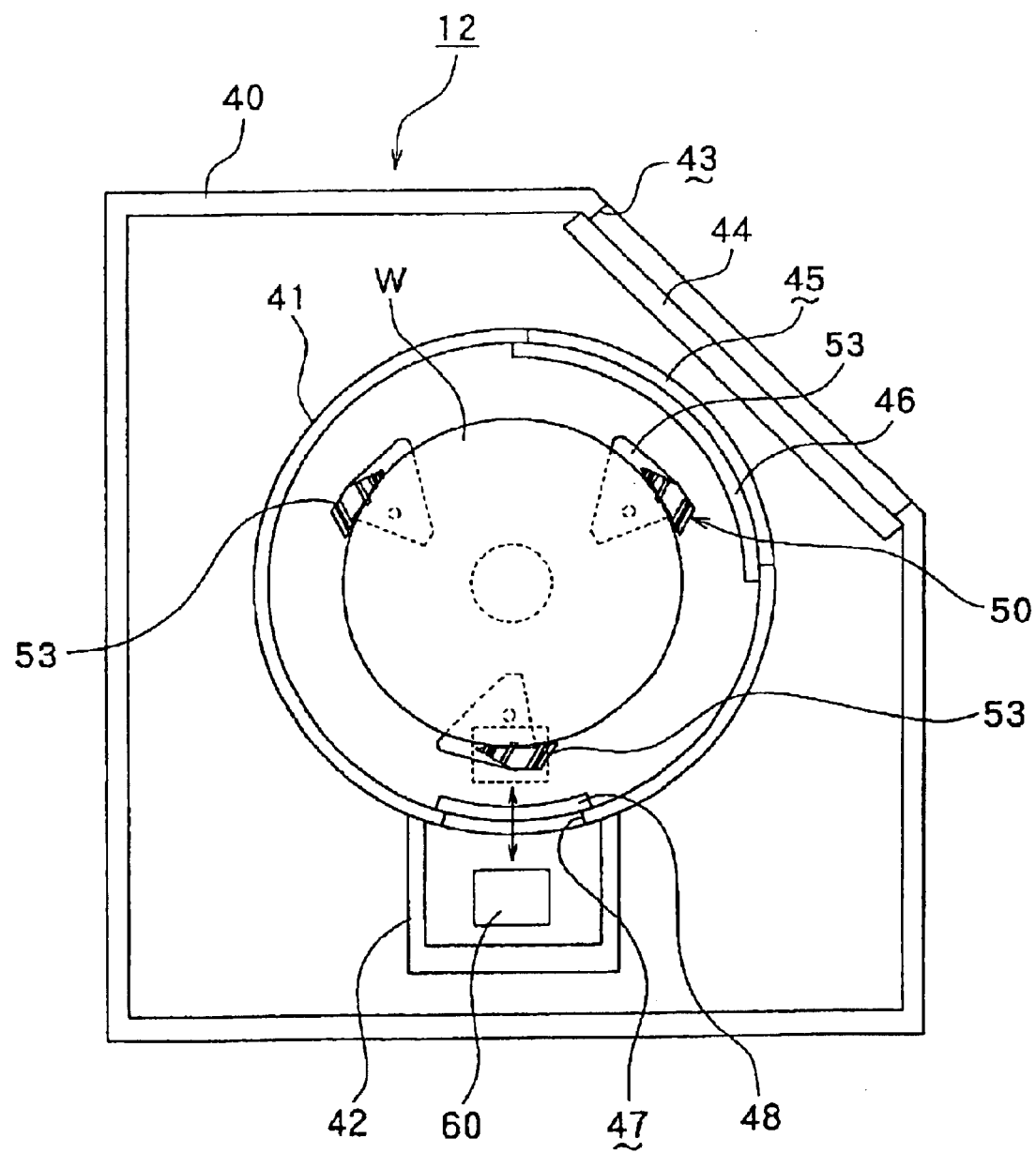
FIG. 10 is a schematic plan view of a substrate cleaning unit and a spin chuck included in the semiconductor wafer processing system shown in FIG. 1.

Referring to FIG. 10 showing the substrate cleaning unit 12 in a plan view, an airtight outer cup 41 for accommodating a wafer W and an edge arm housing 42 are disposed in a unit casing 40. The unit casing 40 has one sidewall provided with an opening 43, and a mechanical shutter 44 closes the opening 43. The mechanical shutter 44 is opened when the wafer carrying arm 19 carries a wafer W into the substrate cleaning unit 12 and when the same carries out a wafer W from the substrate cleaning unit 12. The mechanical shutter 44 is placed on the inner surface of the side wall to prevent the atmosphere in the unit casing 40 from leaking from the unit casing 40 even when the pressure in the unit casing 40 is higher than the atmospheric pressure. The outer cup 41 is provided with an opening 45, and a mechanical shutter 46 operated by a shutter operating mechanism, not shown, closes the opening 45. The mechanical shutter 46 is opened when the wafer carrying arm 19 carries a wafer W through the opening 45 into the outer cup 41 and when the same carries out a wafer W through the opening 45 from the outer cup 41. The mechanical shutters 44 and 46 may be operated by a common shutter operating mechanism. The mechanical shutter 46 is placed on the inner surface of the outer cup 41 to prevent the atmosphere in the outer cup 41 from leaking from the outer cup 41 even when the pressure in the outer cup 41 is higher than the atmospheric pressure.

The edge arm housing 42 is provided with an opening 47, and a shutter 48 operated by a shutter operating mechanism, not shown, closes the opening 47. The shutter 48 is closed to isolate the edge arm housing 42 from the atmosphere in the outer cup 41. The shutter 48 is placed on the inner surface of the outer cup 41 to prevent the atmosphere in the outer cup 41 from leaking into the edge arm housing 42 even when the pressure in the outer cup 41 is higher than the atmospheric pressure.

An edge arm 60 capable of discharging a chemical liquid, pure water and an inert gas, such as nitrogen gas ($N_2$ gas) is accommodated in the edge arm housing 42. The edge arm 60 can be moved to a peripheral part of a wafer W held by spin chucks 50 in the outer cup 41. The edge arm 60 is held in the edge arm housing 42 when the same is not in use. The shutter 48 is opened when the edge arm 60 is advanced from the edge arm housing 42 through the opening 47 into the outer cup 41.

Figure 11:
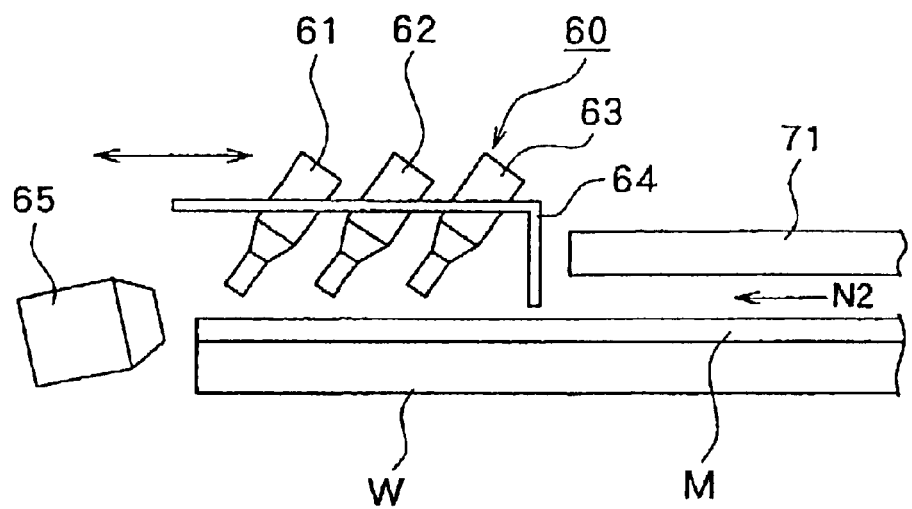
FIG. 11 is a schematic side elevation of an edge arm included in the semiconductor wafer processing system shown in FIG. 1.

Referring to FIG. 11, the edge arm 60 is provided with a chemical liquid jetting nozzle 61 for jetting a chemical liquid on a wafer W coated with a metal film M, a pure water jetting nozzle 62 for jetting pure water, i.e., an inert liquid, and a $N_2$ gas jetting nozzle 63 for discharging $N_2$ gas, i.e., an inert gas. The chemical liquid jetting nozzle 61, the pure water jetting nozzle 62 and the $N_2$ gas jetting nozzle 63 are held on a screening plate 64 in a linear arrangement corresponding to a line extending between the center and the edge of the wafer W, i.e., a radius of the circular wafer W. The surface of the wafer W is coated with the metal film M, such as a copper film. The chemical liquid jetting nozzle 61 jets a chemical liquid capable of dissolving and removing the metal film M. The pure water jetting nozzle 62 disposed on the radially inner side of the chemical liquid jetting nozzle 61 jets pure water for rinsing the wafer W. The $N_2$ gas jetting nozzle 63 disposed on the radially inner side of the pure water jetting nozzle 62 jets $N_2$ gas to dry the wafer W. The screening plate 64 prevents the chemical liquid, pure water and $N_2$ gas respectively jetted through the chemical liquid jetting nozzle 61, the pure water jetting nozzle 62 and the $N_2$ gas jetting nozzle 63 from scattering. The chemical liquid jetting nozzle 61, the pure water jetting nozzle 62 and the $N_2$ gas jetting nozzle 63 are tilted so as to jet the chemical liquid, pure water and $N_2$ gas obliquely toward the periphery of the wafer W; that is, the respective tips of the chemical liquid jetting nozzle 61, the pure water jetting nozzle 62 and the $N_2$ gas jetting nozzle 63 are directed toward the periphery of the wafer W. A suction nozzle 65 is disposed on the outer side of the circumference of the wafer W to suck the chemical liquid, pure water and $N_2$ gas respectively jetted through the chemical liquid jetting nozzle 61, the pure water jetting nozzle 62 and the $N_2$ gas jetting nozzle 63 onto the wafer W and an atmosphere produced by the cleaning process.

Figure 12:
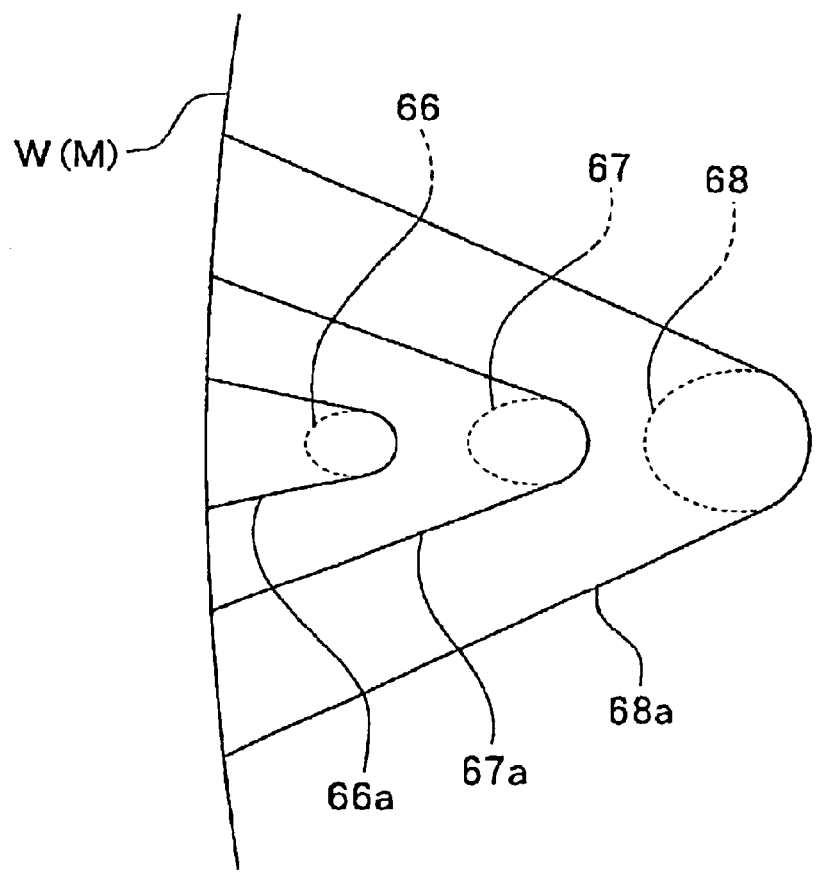
FIG. 12 is a partial plan view of a wafer of assistance in explaining the respective flowing modes of processing fluids fed through a chemical liquid feed nozzle, a pure water feed nozzle and $N_2$ gas feed nozzle onto the upper surface of the wafer.

The $N_2$ gas jetting nozzle 63 starts jetting $N_2$ gas before the chemical liquid jetting nozzle 61 starts jetting the chemical liquid. As shown in FIG. 12, the $N_2$ gas jetting nozzle 63 jets $N_2$ gas onto a region 68. Then, the $N_2$ gas flows along the surface of the wafer W (the surface of the metal film M) toward the circumference of the wafer W, spreading out in a fan-shaped region 68a. The chemical liquid jetting nozzle 61 jets the chemical liquid onto a region 66. Then, the chemical liquid flows along the surface of the wafer W (the surface of the metal film M) toward the circumference of the wafer W, spreading out in a fan-shaped region 66a. The regions 66 and 66a are included in the fan-shaped region 68a. Therefore, the chemical liquid can be surely jetted onto the region 66 and is forced to flow toward the circumference of the wafer W by the $N_2$ gas spreading in the fan-shaped region 68a when the $N_2$ gas jetting nozzle 63 starts jetting $N_2$ gas before the chemical liquid jetting nozzle 61 starts jetting the chemical liquid. Thus, the chemical liquid jetted through the chemical liquid jetting nozzle 61 never flows toward the center of the wafer W. The $N_2$ gas jetting nozzle 63 starts jetting $N_2$ gas onto the region 68 before the pure water jetting nozzle 62 starts jetting pure water. Then, the $N_2$ gas flows along the surface of the wafer W (the surface of the metal film M) toward the circumference of the wafer W, spreading out in the fan-shaped region 68a. The pure water jetting nozzle 62 jets pure water onto a region 67. Then, the pure water flows along the surface of the wafer W (the surface of the metal film M) toward the circumference of the wafer W, spreading out in a fan-shaped region 67a. The regions 67 and 67a are included in the fan-shaped region 68a. Therefore, the pure water can be surely jetted onto the region 67 and is forced to flow toward the circumference of the wafer W by the $N_2$ gas spreading in the fan-shaped region 68a when the $N_2$ gas jetting nozzle 63 starts jetting $N_2$ gas before the pure water jetting nozzle 62 starts jetting pure water. Thus, the pure water jetted through the pure water jetting nozzle 62 never flows toward the center of the wafer W. It is preferable that the region 68 onto which $N_2$ gas is jetted is wider than the regions 66 and 67 to enable the $N_2$ gas that flows spreading in the fan-shaped region 68a to force the chemical liquid and the pure water to flow surely toward the circumference of the wafer W. As shown in FIG. 12, $N_2$ gas can be jetted onto the wafer W so that the width of the fan-shaped region 68a on the circumference of the wafer W is surely greater tan those of the fan-shaped regions 66a and 67a on the circumference of the wafer W.

Figure 13:
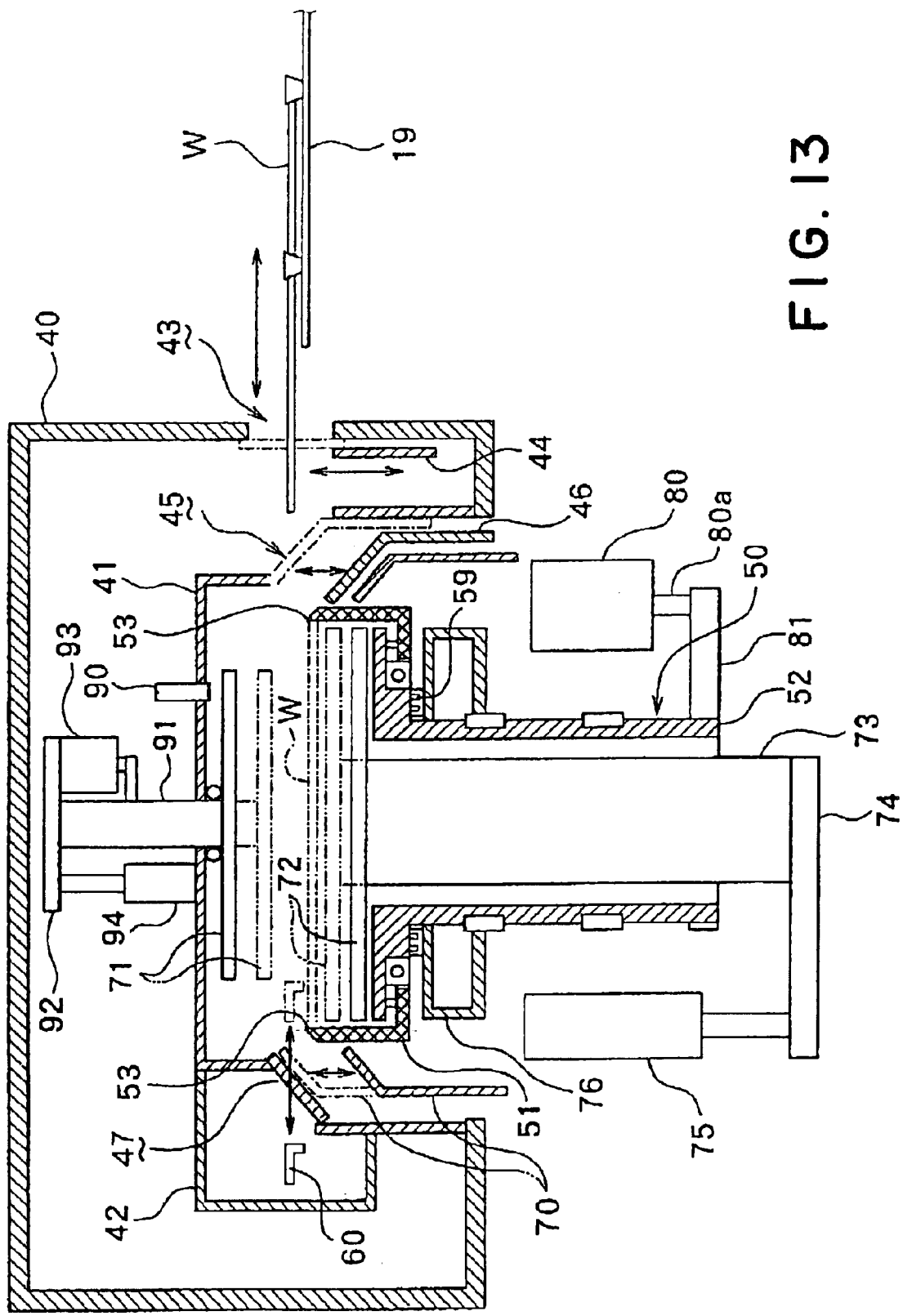
FIG. 13 is a sectional view of the substrate cleaning unit and the spin chuck.

Referring to FIG. 13, arranged in the outer cup 41 are an inner cup 70 for housing a wafer W, a rotating spin chuck 50 for holding a wafer W with its front surface facing up in the inner cup 70, and a top plate 71 capable of being placed close to the surface of a wafer W held on the spin chuck 50. The top wall of the outer cup 41 is provided with a gas supply nozzle 90. An inert gas of a predetermined temperature is discharged through the gas supply nozzle 90 into a space around the wafer W. The spin chuck 50 has a chuck body 51 for holding a wafer W in a horizontal position, and a hollow shaft 52 connected to the bottom of the chuck body 51. An under plate 72 is placed in the chuck body 51 so as to be movable relative to the wafer W between a position near the back surface of the wafer W and a position apart from the back surface of the wafer W. Three wafer holding members 53 are supported on the chuck body 51 at equal angular intervals of 120°. The wafer holding members 53 position the wafer W so that the wafer W is centered on the chuck body 51. A timing belt 81 is extended between the hollow shaft 52 and the drive shaft of a motor 80 to drive the spin chuck 50 for rotation by the motor 80. The motor 80 is, for example, a servomotor and is controlled by a control signal provided by a controller, not shown, such as a CPU, for rotation at a low rotating speed and at a high rotating speed.

Figure 14:
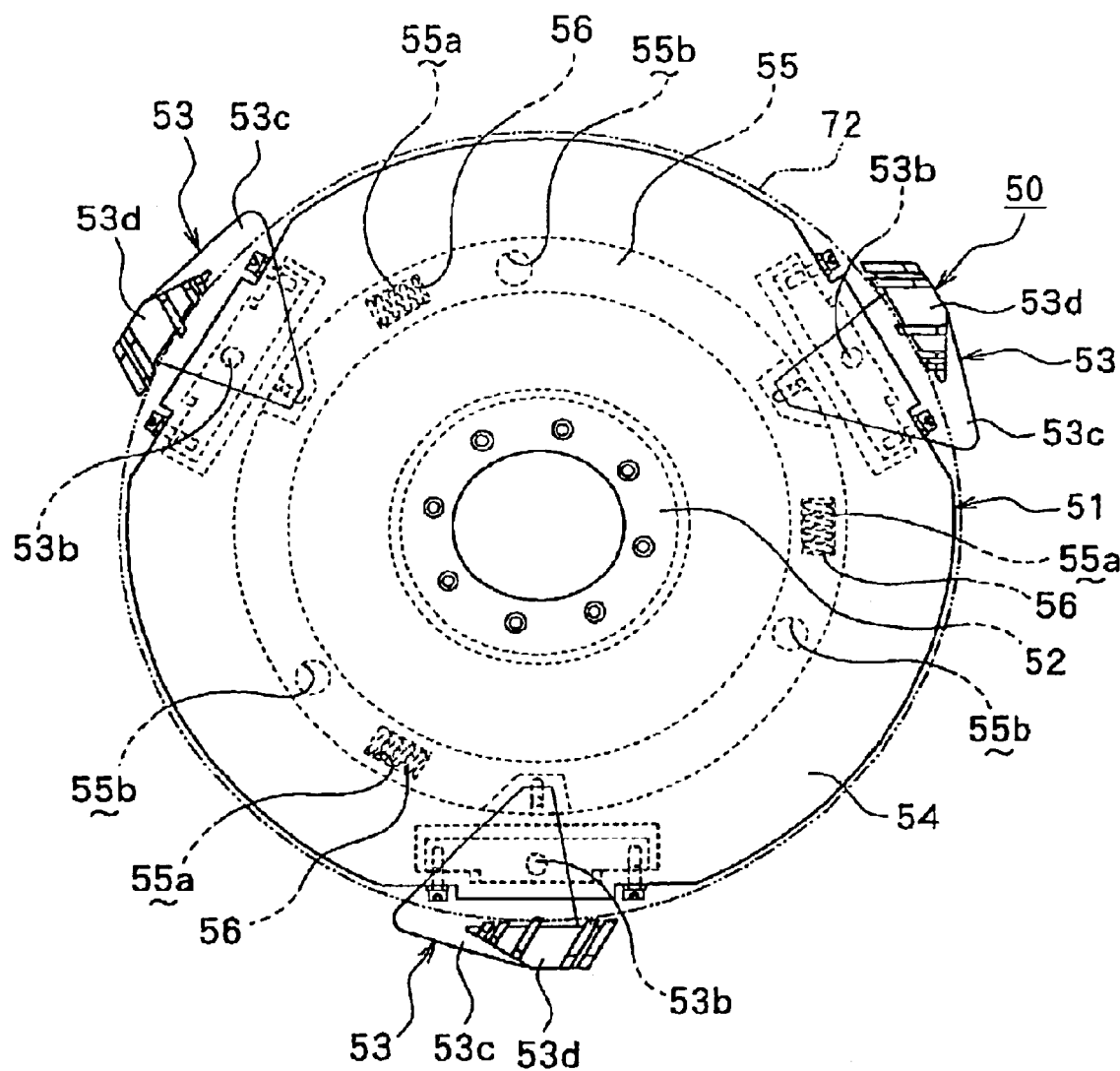
FIG. 14 is a plan view of the spin chuck.

Referring to FIGS. 14 and 15, the chuck body 51 has a disk-shaped base part 54, and a ring 55 put on a boss 54a concentric with the base part 54 and protruding downward from the lower surface of the base part 54 so as to slide for turning relative to the boss 54a. A sealing member 59, such as a labyrinth seal, is placed between the lower surface of the chuck body 51 and the upper surface of a fixed base 76. The ring 55 is provided with, for example, three recesses 55a arranged at equal angular intervals, and compressed compression coil springs 56 are held in the recesses 55a, respectively. Each compression coil spring 56 has one end engaged with the base part 564 and the other end 55 engaged with the ring 55. The ring 55 is always biased in one direction, i.e., a counterclockwise direction as viewed in FIG. 14, by the resilient forces of the compression coil springs 56. The ring 55 is provided in its lower surface with, for example, three round holes 55b at equal angular intervals.

Figure 16A:
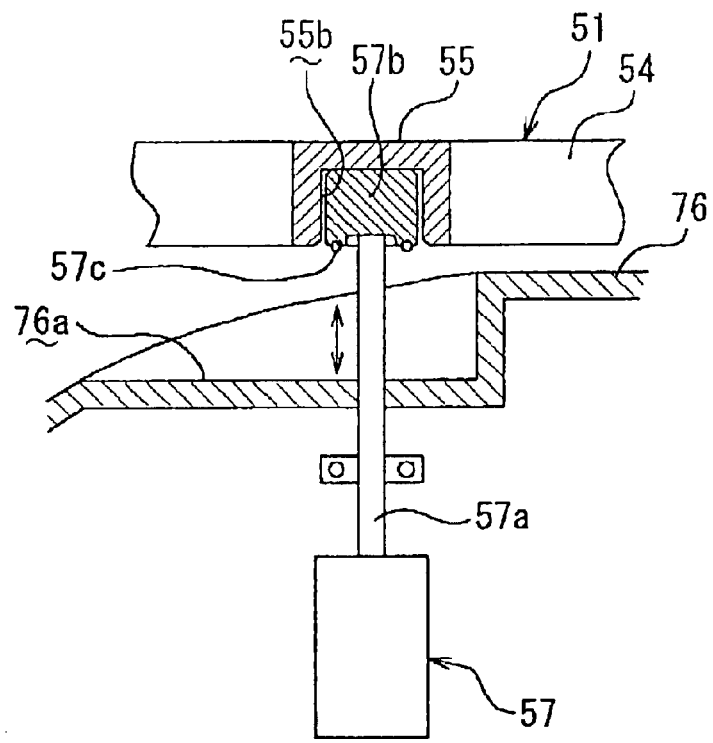
FIGS. 16A and 16B are sectional views of a locking mechanism included in the spin chuck in a locking state and in an unlocking state, respectively.
Figure 16B:
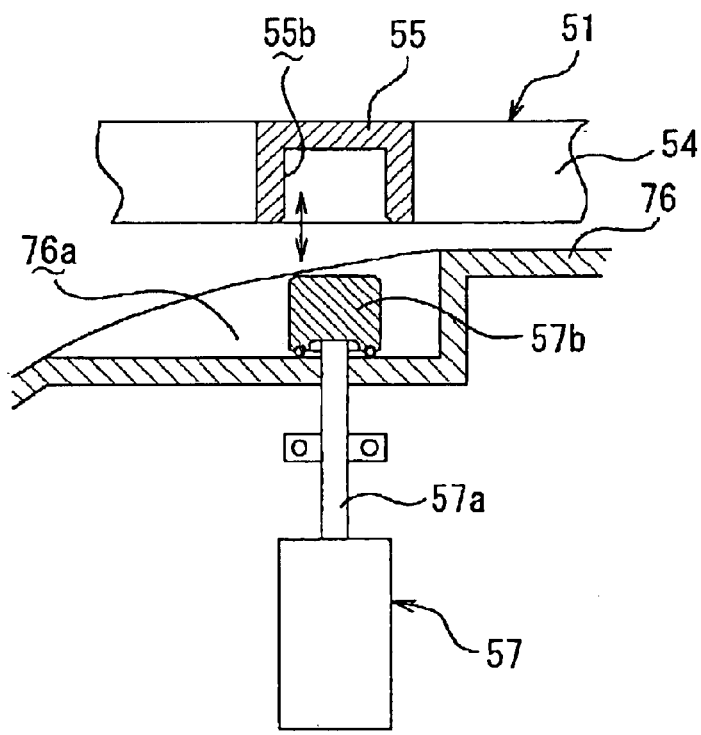

A cylindrical locking member 57b attached to the upper end of a vertically movable piston rod 57a included in a locking mechanism 57 having a pneumatic cylinder actuator and attached to the fixed base 76 below the chuck body 51 can be engaged in and disengaged from each round holes 55b. When the spin chuck 50 is not in operation, the locking members 57b of the locking mechanisms 57 are engaged in the round holes 55b to restrain the chuck body 51 from rotation. When the spin chuck 50 is in operation, the locking members 57b of the locking mechanisms 57 are disengaged from the round holes 55b to allow the spin chuck 50 to rotate. As shown in FIGS. 16A and 16B, An O-ring 57c is attached to the lower surface of each locking member 57b. The O ring 57c comes into close contact with the upper surface or a recessed part 76a of the fixed base 76 when the locking member 57b is disengaged from the round hole 55b.

Figure 15A:
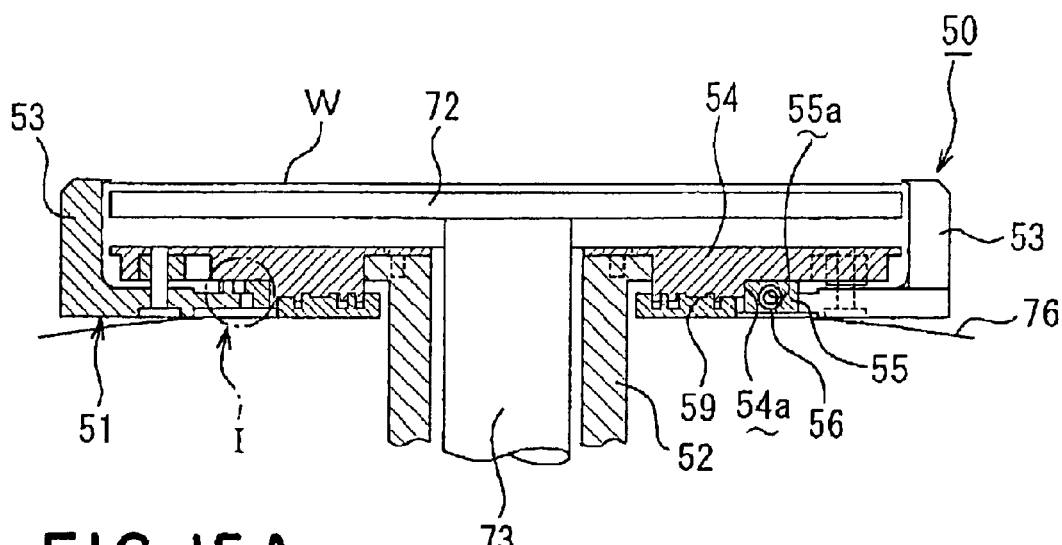
FIG. 15A is a sectional view of the spin chuck.
Figure 15B:
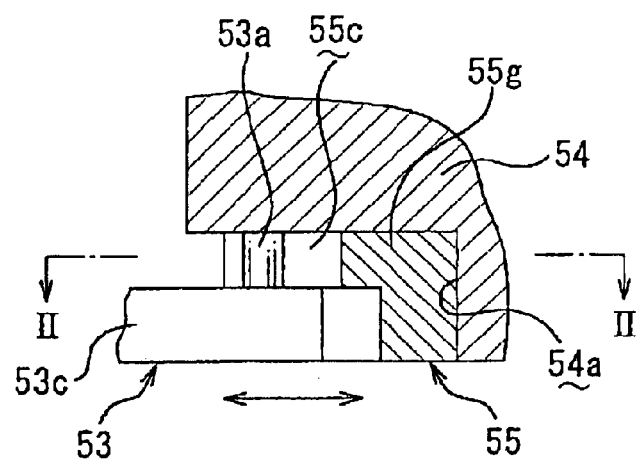
FIG. 15B is an enlarged sectional view of a part I in FIG. 15A.
Figure 15C:
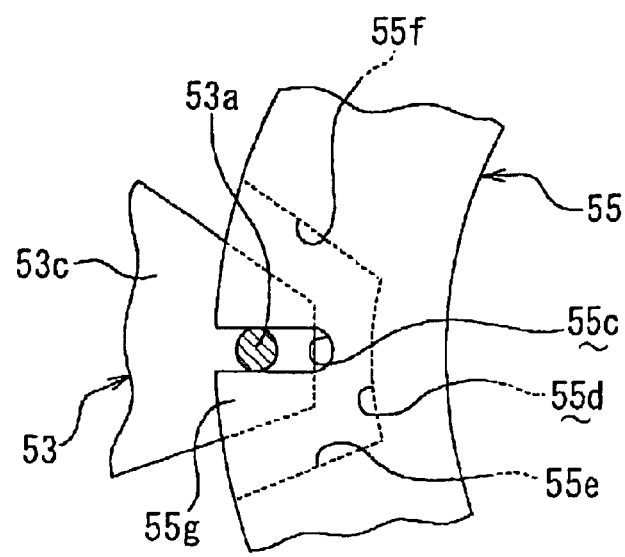
FIG. 15C is a sectional view taken on line II—II in FIG. 15B.

The ring 55 is provided in its outer circumference with, for example, three guide recesses 55d at equal angular intervals. Each guide recess 55d is provided with a guide groove 55c for guiding the wafer holding member 53. As shown in FIGS. 15A to 15C, the guide recess 55d is formed in the lower surface of a peripheral part of the ring 55 so as to open radially outward and downward. The guide recess 55d has opposite side walls 55e and 55f diverging radially outward from each other. The upper surface of the ring 55 extends over the guide recesses 55d. The guide groove 55c is formed in a part 55g, extending over each guide recess 55d, of the ring 55 so as to open in the outer circumference of the ring 55. A guide pin 53a set upright on the wafer holding member 53 is engaged slidably in the guide groove 55c.

Figure 17A:
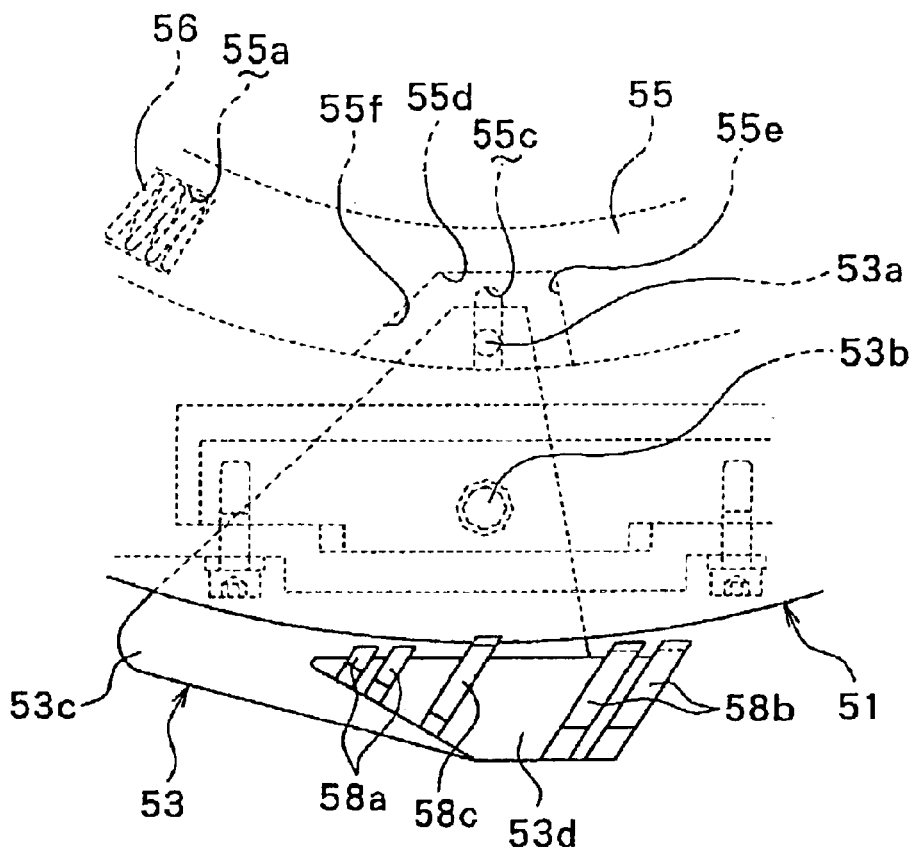
FIGS. 17A and 17B are a plan view and a side elevation, respectively, of an essential part of the spin chuck holding a wafer in a stationary state.
Figure 17B:
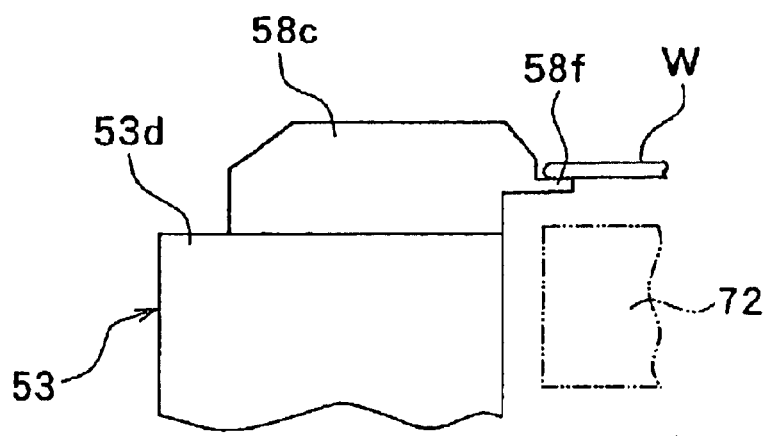
Figure 18A:
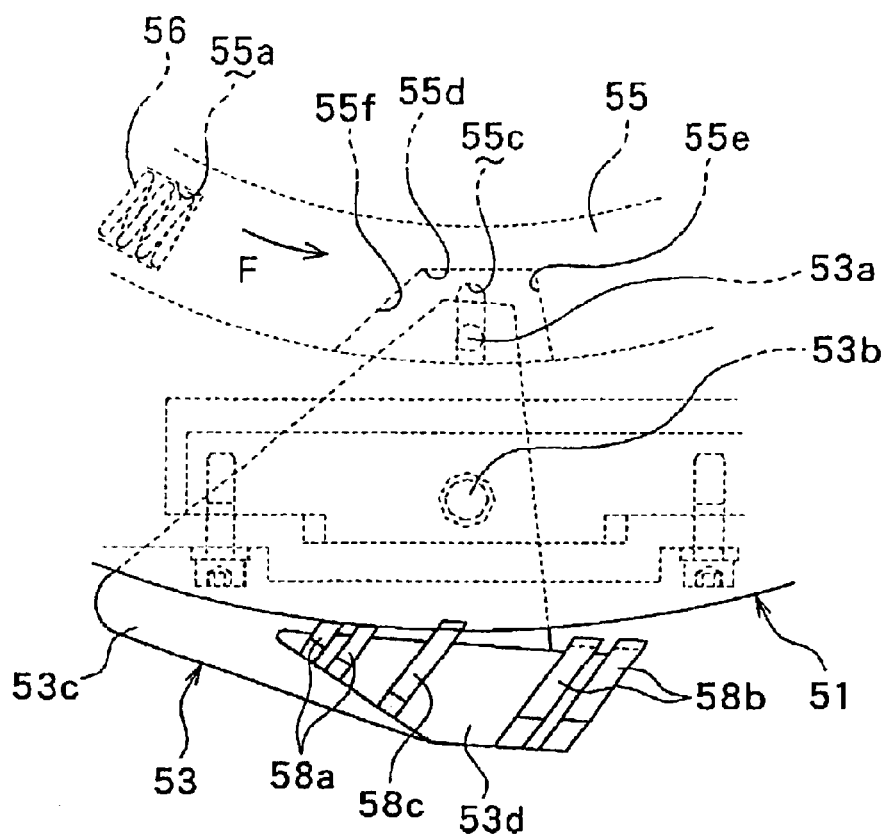
FIGS. 18A and 18B are plan view and a side elevation, respectively, of an essential part of the spin chuck holding a wafer and rotating at a low rotating speed.
Figure 18B:
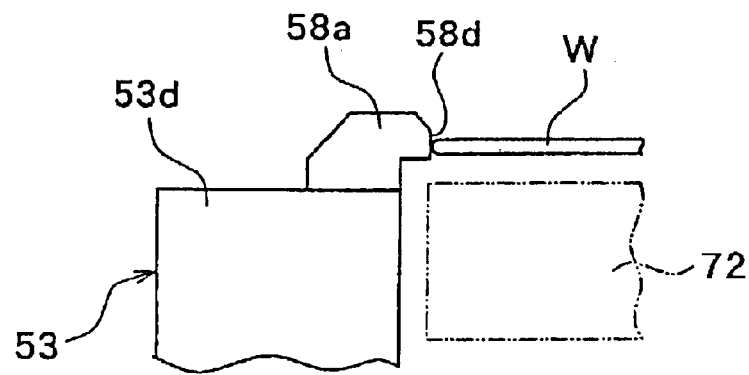
Figure 19A:
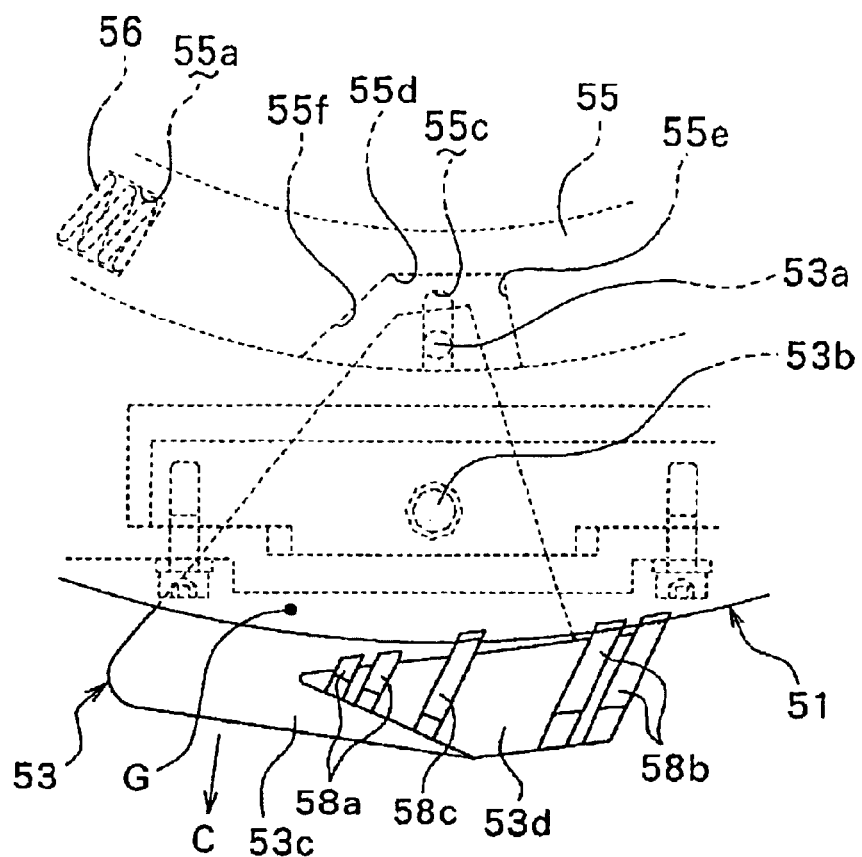
FIGS. 19A and 19B are a plan view and a side elevation, respectively, of an essential part of the spin chuck holding a wafer and rotating at a high rotating speed.
Figure 19B:
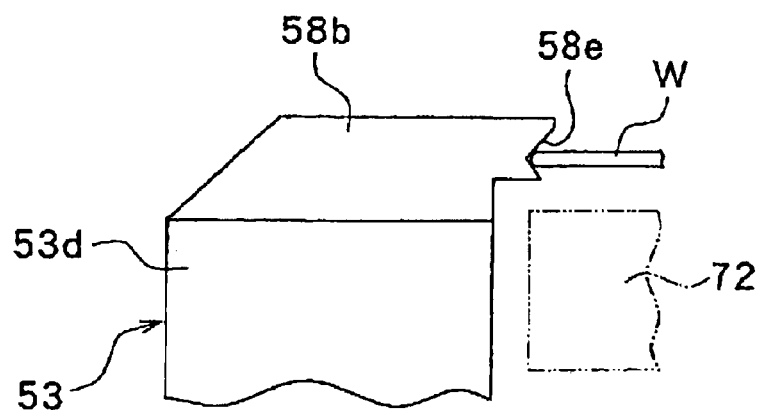

The wafer holding member 53 is held for turning on the lower surface of a peripheral part of the base part 54 of the chuck body 54 by a pivotal pin 53b. The wafer holding member 53 has a flat part 53c having a substantially triangular shape in a plan view, and a holding part 53d standing upright from the outer end of the flat part 53c. As shown in FIGS. 19A and 19B, the position of the pivotal pin 53b on the flat part 53c is spaced from the center G of gravity of the flat part 53c. The guide pin 53a is attached to an inner end part of the flat part 53c. The holding part 53d is provided with two first holding parts 58a that come into contact with the circumference of the wafer W when the spin chuck 50 rotates at a low rotating speed in the range of, for example, 10 to 300 rpm, two second holding parts 58b that come into contact with the circumference of the wafer W when the spin chuck 50 rotates at a high rotating speed in the range of, for example, 500 to 2000 rpm and one third holding part 58c that comes into contact with the circumference of the wafer W while the spin chuck 50 is stationary. The first holding parts 58a are behind the second holding parts 58b with respect to the rotating direction of the spin chuck 50, and the third holding part 58c is positioned between the first holding parts 58a and the second holding parts 58b. The third holding part 58c separates from the wafer W and the second holding parts 58b come into contact with the wafer W as the rotating speed of the spin chuck 50 rises to rotating speeds in the range of 300 to 500 rpm. As shown in FIGS. 18A and 18B, the two first holding parts 58a are arranged parallel and have vertical inner end surfaces 58d, respectively. The vertical inner end surfaces 58d come into contact with the circumference of the wafer W. The vertical inner end surfaces 58d of the first holding parts 58a are kept firmly in contact with the circumference of the wafer W by the resilient forces F of the compression coil springs 56 pressing the wafer W horizontally in the rotating direction. As shown in FIGS. 19A and 19B, the second holding parts 58b are arranged parallel and have V-grooved inner ends 58e, respectively. The side surfaces of the V-grooved inner end 58e of each second holding part 58b come into contact with the edges of the upper and the lower surface of the wafer W, respectively, to hold the wafer W firmly. As shown in FIGS. 17A and 17B, the third holding part 58c has a horizontal lug 58f projecting from its inner end. The horizontal lug 58f of the third holding part 58c comes into contact with the lower surface of the wafer W.

In placing a wafer W on the spin chuck 50, the locking members 57b of the locking mechanisms 57 are engaged in the round holes 55b of the ring 55 put on the boss 54a of the base part 54 of the chuck body 51 to lock the spin chuck 50. Then, the wafer carrying arm 19 of the main wafer conveyer 18 holding a wafer W carries the wafer W to a position directly above the chuck body 51, descends and then place the wafer W on the third holding parts 58c as shown in FIG. 17B. Subsequently, the wafer carrying arm 19 is retracted from the position above the spin chuck 50. After the wafer carrying arm 19 has been thus retracted or upon the retraction of the wafer carrying arm 19, the locking members 57b of the locking mechanism 57 are disengaged from the round holes 55b. Then, the motor 80 is actuated to rotate the chuck body 51 at a low rotating speed in the range of, for example, 10 to 300 rpm. At the start of the chuck body 51 for rotation at a rotating speed, the ring 55 is shifted in the rotating direction by the resilient forces F of the compression coil springs 56, the guide pins 53a of the holding members 53 slide along the guide grooves 55c of the ring 55 accordingly, the holding members 53 are turned on the pivotal pins 53b in a direction opposite the rotating direction of the holding members 53, and the vertical inner end surfaces 58d of the first holding parts 58a come into contact with the circumference of the wafer W as shown in FIGS. 18A and 18B. In this state, the wafer W is held firmly by the first holding parts 58a by the agency of the resilient forces F of the compression coil springs 56. Since each compression coil spring 56 exerts the resilient force F on the first holding parts 58a of each of the three holding members 53 arranged at equal angular intervals, the wafer W can be accurately centered on the spin chuck 50. After the spin chuck 50 has been rotated for a predetermined time at the low rotating speed, the spin chuck 50 is rotated at a high rotating speed in the range of, for example, 500 to 2000 rpm. Consequently, the holding members 53 are turned on the pivotal pins 53b in the rotating direction by centrifugal forces C, respectively, and the side surfaces of the V-grooved inner ends 58e of the second holding parts 58b come into contact with the edges of the upper and the lower surface of the wafer W, respectively, to hold the wafer W firmly in place as shown in FIGS. 19A and 19B. Since the first holding parts 58a thus disengage from the wafer W and the second holding parts 58b engage the wafer W, parts with which the first holding parts 58a have been engaged until the second holding parts 58b engage the wafer W can be wetted with the chemical liquid and pure water. The chemical liquid is jetted through the chemical liquid jetting nozzle 61 onto the wafer W while the wafer W is rotating at a high rotating speed together with the spin chuck 50, pure water is jetted through the pure water jetting nozzle 62 onto the wafer W for rinsing, and then $N_2$ gas is jetted through the $N_2$ gas jetting nozzle 63 onto the wafer W for drying. Since the resilient forces F of the compression coil springs 56 are exerted on the first holding parts 58a of the three holding members 53 at the start of the spin chuck 50 for rotation at the low rotating speed to center the wafer W, the chemical liquid can be jetted through the chemical liquid jetting nozzle 61 onto the desired region in the peripheral part of the wafer W for cleaning. Similarly, pure water can be jetted through the pure water jetting nozzle 62 onto the desired region in the peripheral part of the wafer W for rinsing.

After the wafer W has been processed by the cleaning process, the rinsing process and the drying process, the spin chuck 50 is stopped, and then, the spin chuck 50 is locked by actuating the locking mechanism 57 to fit the locking members 57b in the round holes 55b of the ring 55 of the chuck body 51. Then, the holding members 53 are returned to their initial positions shown in FIGS. 17A and 17B, respectively, to seat a peripheral part of the wafer W on the horizontal lugs 58f of the third holding parts 58c. Then, the wafer carrying arm 19 of the main wafer conveyer 18 advances to a position under the wafer W supported on the holding members 53, the wafer carrying arm 19 is raised to receive the wafer W from the spin chuck 50, and then the main wafer conveyer 18 carries the wafer W away from the cleaning unit 12.

Referring to FIG. 13, the under plate 72 is joined to the upper end of a shaft 73. A horizontal connecting plate 74 has one end joined to the lower end of the shaft 73 and the other end connected to a lifting mechanism 75 including a pneumatic cylinder actuator or the like. The under plate 72 and the shaft 73 are moved vertically by the lifting mechanism 75. The under plate 72 can be moved between a lower position (inoperative position) apart from the lower surface of the wafer W supported on the spin chuck 50 indicated by continuous lines in FIG. 13 in the chuck body 51, and an upper position (operative position) close to the lower surface of the wafer W supported on the spin chuck 50 indicated by two-dot chain lines in FIG. 13. The under plate 72 may be held fixedly at a predetermined level, and the hollow shaft 52 may be moved by a lifting mechanism, not shown, to move the spin chuck 50 vertically relative to the under plate 72 so that the under plate 72 can be set at either the operative position or the inoperative position relative to the spin chuck 50. A processing fluid supply line, not shown, is extended trough the shaft 73 to supply the chemical liquid, pure water and $N_2$ gas into a space between the lower surface of the wafer W and the under plate 72. The under plate 72 is provided with, for example, five discharge holes, not shown, at the center and in peripheral parts of the upper surface thereof to discharge the chemical liquid, pure water and $N_2$ gas, The discharge hole at the center of the under plate 72 is directed toward the center of the wafer W, and the discharge holes in the peripheral parts are inclined so as to discharge the fluid toward the circumference of the wafer W. The under plate 72 is internally provided with a temperature regulating water passage, not shown. Temperature regulating water of a predetermined temperature flows through the temperature regulating water passage to maintain the under plate 72 at a predetermined temperature. Temperature regulating water of a predetermined temperature flows into the temperature regulating water passage through an inlet and flows out of the temperature regulating water passage through an outlet. In processing the wafer W held by the spin chuck 50, the under plate 72 is positioned at the upper position close to the back surface of the wafer W, temperature regulating water is circulated through the temperature regulating water passage to regulate the temperature of the under plate 72. Since the under plate 72 is held close to the wafer W, the temperature of the wafer W can be regulated uniformly by the under plate 72. Consequently, the wafer W can be uniformly processed.

The top plate 71 is joined to the lower end of a shaft 91 supported for rotation on a horizontal plate 92. A motor 93 mounted on the horizontal plate 92 drives the shaft 91 to rotate the top plate 71. A shaft lifting mechanism 94 including a pneumatic cylinder actuator or the like is fixedly installed on the top wall of the outer cup 41. The shaft lifting mechanism 94 moves the horizontal plate 92 vertically.

Thus, the top plate 71 is moved vertically between a lower position (operative position) indicated by two-dot chain lines in FIG. 13 close to the upper surface of the wafer W held by the spin chuck 50 and an upper position (inoperative position) indicated by continuous lines in FIG. 13 apart from the upper surface of the wafer W by the shaft lifting mechanism 94. When the top plate 71 is held at the lower position while the wafer W is being processed, the top plate 71 controls the influence of an atmosphere prevailing over the wafer W on the wafer W to maintain the processing liquid and the surface of the wafer W at proper temperatures, respectively. A fluid passage, not shown, for selectively supplying the chemical liquid, pure water or $N_2$ gas into a space between the upper surface of the wafer W and the top plate 71 is formed in the top plate 71 and the shaft 91. While a peripheral part of the wafer W is being cleaned, $N_2$ gas is supplied through the fluid passage into the space between the top plate 71 and the wafer W to prevent the chemical liquid for edge cleaning from flowing toward the center of the wafer W.

Referring to FIG. 13, the inner cup 70 can be moved vertically between a lower position indicated by continuous lines and an upper position indicated by chain lines. When the inner cup 70 is held at the lower position, the spin chuck 50 protrudes upward from the upper end of the inner cup 70 to facilitate placing a wafer W on and taking the same away from the spin chuck 50. When the inner cup 70 is held at the upper position, the inner cup 70 surrounds the spin chuck 50 and the wafer W. When the inner cup 70 is lowered, the outer cup 41 prevents the scattering of the processing liquid supplied onto the upper and the lower surface of the wafer W. When the inner cup 70 is raised, an upper part of the inner cup 70 is positioned close to the inner surface of the outer cup 41, and the inner cup 70 prevents the scattering of the processing liquid supplied onto the upper and the lower surface of the wafer W.

The operation of the substrate processing system for carrying out a process for processing a wafer W will be described. A wafer carrying arm 11 takes out one wafer W at a time from a wafer carrier C placed on the table 6 of the in/out port 4 and carries the wafer W to the lower wafer transfer unit 17. The wafer W is transferred from the wafer carrying arm 11 to the rotating support device 31 of the notch aligner 30 (FIG. 4). Subsequently, the servomotor 32 is actuated to rotate the rotating support device 31 supporting the wafer W in a horizontal plane, and the sensor 33 detects the notch N of the wafer W. Then, the sensor gives a notch detection signal to the CPU 36, the CPU 36 gives a control signal to the servomotor 32 to stop the rotating support device 31. Thus, the wafer W is aligned.

Then, the pneumatic cylinder actuator 35 raises the wafer lifting device 34 to make the wafer lifting device 34 receive the wafer W from the rotating support device 31 and to raise the wafer W above the rotating support device 31 (FIG. 5). In this state, the servomotor 32 is reversed to return the rotating support device 31 to the initial position. Then the piston rod 35a of the pneumatic cylinder actuator 35 is stretched out to lower the wafer lifting device 34 so that the wafer W is transferred from the wafer lifting device 34 to the rotating support device 31 held at the initial position. Thus, the notch aligner 30 of the wafer transfer unit 17 determines the orientation of the wafer W.

Then, the wafer carrying arm 19 of the main wafer conveyer 18 receives the wafer W from the wafer transfer unit 17, and the main wafer conveyer 18 carries the wafer W to one of the substrate processing units 23a to 23h. It is supposed herein that the substrate processing unit 23a is used. A resist film deposited on the upper surface of the wafer W is water-solubilized by a predetermined water-solubilizing process. Then, the wafer carrying arm 19 of the main wafer conveyer 18 carries the thus processed wafer W from the substrate processing unit 23a. Then, the wafer carrying arm 19 carries the wafer W to one of the substrate cleaning units 12 to 15. It is supposed herein that the substrate cleaning unit 14 is used. The substrate cleaning unit 14 carries out a cleaning process using pure water to remove the water-solubilized resist film from the wafer W. When necessary, the substrate cleaning unit 14 processes the cleaned wafer W by a chemical liquid to remove particles and metals from the wafer W and dries the wafer W. Then, the wafer carrying arm 19 carries the thus cleaned wafer W from the substrate cleaning unit 14 to the upper wafer transfer unit 16. Then, the wafer carrying arm 11 receives the wafer W from the upper wafer transfer unit 16 and put the clean wafer W into a wafer carrier C.

The substrate cleaning units 12 and 13 are the same in function and operation. Therefore the operation of the substrate cleaning unit 12 will be described by way of example. The mechanical shutter 44 of the unit casing 40 and the mechanical shutter 46 of the outer cup 41 are opened. At this stage, the inner cup 70 is at its lower position to make the chuck body 41 protrude from the upper end of the inner cup 70, the under plate 71 is lowered to its lower position (inoperative position) in the chuck body 51, the top plate 71 is raised to its upper position (inoperative position), and the shutter 48 of the edge arm housing 42 is closed.

Then, the wafer carrying arm 19 holding a wafer W advances to a position above the spin chuck 50, and descends to place the wafer W on the third holding parts 58c of the wafer holding members 53 (FIGS. 17A and 17B). Then, the wafer carrying arm 19 is retracted from the outer cup 41 and the unit housing 40, and the mechanical shutters 44 and 46 are closed. Subsequently, the inner cup 70 is raised to surround the chuck body 51 holding the wafer W. The under plate 72 is raised to the operative position in the chuck body 51 such that a space of a thickness in the range of, for example, about 0.5 to about 3 mm is formed between the under plate held at the operative position and the lower surface of the wafer W.

Subsequently, a cleaning process is carried out to clean the back surface and a peripheral part of the wafer W. The locking mechanisms 57 are actuated to disengage the locking members 57b from the round holes 55b. then, the motor 80 is actuated to drive the chuck body 51 at a low rotating speed in the range of, for example, 10 to 30 rpm. At the start of the chuck body 51 for rotation at the low rotating speed, the ring 55 is shifted in the rotating direction by the resilient forces F of the compression coil springs 56, the guide pins 53a of the holding members 53 slide along the guide grooves 55c of the ring 55 accordingly, the holding members 53 are turned on the pivotal pins 53b in a direction opposite the rotating direction of the chuck body 51, and the vertical inner end surfaces 58d of the first holding parts 58a come into contact with the circumference of the wafer W as shown in FIGS. 18A and 18B. In this state, the wafer W is held firmly by the first holding parts 58a by the agency of the resilient forces F of the compression coil springs 56. Since each compression coil spring 56 exerts the resilient force F on the first holding parts 58a of each of the three holding members 53 arranged at equal angular intervals, the wafer W can be accurately centered on the spin chuck 50. A cleaning chemical liquid supplied through a lower fluid passage, not shown, is discharged gradually into the space between the lower surface of the wafer W and the upper surface of the under plate 72 so as to wet the lower surface of the wafer W entirely with the cleaning chemical liquid. After thus wetting the entire lower surface of the wafer W with the cleaning chemical liquid, the supply of the cleaning chemical liquid is stopped and the lower surface of the wafer W is cleaned. During this cleaning operation, the spin chuck 50 is rotated at a comparatively low rotating speed in the range of, for example, 10 to 30 rpm so that the film of the cleaning chemical liquid formed on the lower surface of the wafer W may not be broken. Consequently, the cleaning chemical liquid forming the film on the lower surface of the wafer W flows in the film and does not stay stagnant, which improves cleaning efficiency. The cleaning chemical liquid is discharged from the under plate 72 so as to fill up the space between the lower surface of the wafer W and the upper surface of the under plate 72 with the cleaning chemical liquid and to make part of the cleaning chemical liquid flow via the circumference of the wafer W onto a peripheral part of the upper surface (the surface of a metal film M) of the wafer W. Thus, both the lower surface and the peripheral part of the upper surface of the wafer W are cleaned.

Then, the spin chuck 50 is rotated at, for example, 200 rpm for five seconds to spin the cleaning chemical liquid off the wafer W. The cleaning chemical liquid removed from the wafer W is drained through a drain pipe, not shown, connected to the inner cup 70. When the spin chuck 50 is rotated at a high rotating speed, the holding members 53 are turned on the pivotal pins 53b in the rotating direction by centrifugal forces C, respectively, and the side surfaces of the V-grooved inner ends 58e of the second holding parts 58b come into contact with the edges of the upper and the lower surface of the wafer W, respectively, to hold the wafer W firmly in place as shown in FIGS. 19A and 19B. Since the first holding parts 58a thus disengage from the wafer W and the second holding parts 58b engage with the wafer W, parts with which the first holding parts 58a have been engaged until the second holding parts 58b engage with the wafer W can be wetted with the cleaning chemical liquid. Since the side surfaces of the V-grooved inner ends 58e of the second holding parts 58b are in line-contact only with parts of the edges of the upper and the lower surface of the wafer W, the cleaning chemical liquid is able to wet the wafer W substantially entirely, which improves cleaning efficiency.

Then, the top plate 71 is moved to a position close to the upper surface of the wafer W. The shutter 48 of the edge arm housing 42 is opened, the edge arm 60 is moved to a position above a peripheral part of the wafer W held on the spin chuck 50. Subsequently, the $N_2$ gas jetting nozzle 63 starts jetting $N_2$ gas, and then, the chemical liquid jetting nozzle 61 starts jetting the chemical liquid to remove a peripheral part of the metal film M formed on the upper surface of the wafer W by a peripheral film removing process. The spin chuck 50 is rotated at a rotating speed, for example, on the order of 300 rpm during the peripheral film removing process. During the peripheral film removing process, the three holding members 53 are turned in the rotating direction of the spin chuck 50 by the centrifugal forces C and the side surfaces of the V-grooved inner ends 58e of the second holding parts 58b are in contact with the edges of the upper and the lower surface of the wafer W to hold the wafer firmly in place as shown in FIGS. 19A and 19B. Since the tip of the chemical liquid jetting nozzle 61 is directed toward the periphery of the wafer W, the chemical liquid flows smoothly radially outward on the wafer W. The chemical liquid jetted onto the wafer W through the chemical liquid jetting nozzle 61 can be efficiently forced to flow radially outward by $N_2$ gas jetted through the $N_2$ gas jetting nozzle 63 because the tip of the N₂ gas jetting nozzle 63 is directed toward the periphery of the wafer W (FIG. 12).

The top plate 71 is held at the lower position (operative position) indicated by two-dot chain lines in FIG. 13 and N₂ gas is jetted through an upper fluid passage, not shown, during the peripheral film removing process. Thus, the flow of the chemical liquid jetted through the chemical liquid jetting nozzle 61 and a chemical atmosphere produced during the peripheral film removing process toward the center of the wafer W can be prevented. The N₂ gas jetted through the N₂ gas jetting nozzle 63 prevents the chemical liquid from flowing outside an area in which the N₂ gas flows, and the N₂ gas supplied through the upper fluid passage prevents the flow of the chemical liquid toward the center of the wafer W, so that the flow of the chemical liquid into a radially inner part of the surface of the wafer W can be effectively prevented. The N₂ gas supplied through the upper fluid passage prevents also the formation of water marks on the upper surface of the wafer W.

During the peripheral film removing process, N₂ gas is supplied through the gas supply nozzle 90 connected to the top wall of the outer cup 41 into a space over the top plate 71 to produce a down flow of the N₂ gas. Thus, the space extending over the top plate 71 in the outer cup 41 is filled up with N₂ gas, so that a chemical liquid atmosphere containing the chemical liquid evaporated from a chemical liquid film is unable to flow into the space extending over the top plate 71. Therefore, any chemical liquid does not remain in an upper region of the interior of the outer cup 41 after the completion of the peripheral film removing process.

The supply of the chemical liquid through the chemical liquid jetting nozzle 61 is stopped after the peripheral film removing process has been completed, while the supply of N₂ gas is continued. Then, the pure water jetting nozzle 62 starts jetting pure water to rinse the peripheral part of the wafer W with pure water by a rinsing process. Since the tip of the pure water jetting nozzle 62 is directed toward the periphery of the wafer W, pure water flows smoothly toward the periphery of the wafer W. The N₂ gas jetted through the N₂ gas jetting nozzle 63 forces the pure water jetted through the pure water jetting nozzle 62 to flow toward the periphery of the wafer W. Since the tip of the N₂ gas jetting nozzle 63 is directed toward the periphery of the wafer W, the pure water can be effectively forced to flow toward the periphery of the wafer W (FIG. 12). The pure water thus forced to flow, the N₂ gas and the pure water jetted onto the wafer W, and an atmosphere of vapors produced by the process are sucked and drained through the suction nozzle 65. Since the tip of the pure water jetting nozzle 62 is directed toward the periphery of the wafer W, pure water flows smoothly toward the periphery of the wafer W. The screening plate 64 holding the chemical liquid jetting nozzle 61, the pure water jetting nozzle 62 and the N₂ gas jetting nozzle 63 prevents pure water from scattering toward a radially inner part of the surface of the wafer W. Pure water is supplied through the lower fluid passage, not shown, formed in the under plate 72 into the space between the under plate 72 and the lower surface of the wafer W to rinse the lower surface of the wafer W. Thus, the peripheral part of the upper surface and the lower surface of the wafer W are rinsed to wash off the chemical liquid from the wafer W by a rinsing process. The top plate 71 is held at the operative position and N₂ gas is supplied through the upper fluid passage, not shown, formed in the top plate 71 into the space between the top plate 71 and the wafer W during the rinsing process. The N₂ gas supplied through the upper fluid passage prevents the flow of pure water jetted through the pure water jetting nozzle 62 and the atmosphere of vapors produced by the rinsing process toward the center of the upper surface of the wafer W. Thus, the N₂ gas jetted through the N₂ gas jetting nozzle 63 prevents the pure water from flowing outside an area in which the N₂ gas flows, and the N₂ gas supplied through the upper fluid passage prevents the flow of the pure water toward the center of the wafer W, so that the flow of the pure water into a radially inner part of the surface of the wafer W can be effectively prevented. The N₂ gas supplied through the upper fluid passage prevents also the formation of water marks on the upper surface of the wafer W.

The supply of pure water through the pure water jetting nozzle 62 and the lower fluid passage is stopped after the rinsing process has been completed, while the supply of N₂ gas through the N₂ gas jetting nozzle 63 is continued for a drying process for drying the peripheral part of the wafer W. Since the tip of the N₂ gas jetting nozzle 63 is directed toward the periphery of the wafer W, N₂ gas flows smoothly toward the periphery of the wafer W. The N₂ gas jetted through the N₂ gas jetting nozzle 63 is sucked and discharged through the suction nozzle 65. N₂ gas is supplied through the lower fluid passage, not shown, formed in the under plate 72 into the space between the under plate 72 and the lower surface of the wafer W for a drying process for drying the peripheral part and the lower surface of the wafer W. After the completion of the drying process for drying the peripheral part and the lower surface of the wafer W, the supply of N₂ gas through the N₂ gas jetting nozzle 63 and the lower fluid passage is stopped, the top plate 71 is raised away fro the upper surface of the wafer W. Then, the wafer W is rotated at a high rotating speed, for example on the order of 1500 rpm, which is higher than a rotating speed at which the wafer W is rotated during the drying process, for spin drying. During the spin drying of the wafer W, the second holding parts 58b of the holding members 53 are pressed against the circumference of the wafer W by centrifugal forces C acting on the holding members 53 to hold the wafer W firmly in place as shown in FIGS. 19A and 19B.

The spin chuck 50 is stopped after the completion of the drying process. Subsequently, the locking mechanisms 57 are actuated so that the locking members 57b are engaged in the round holes 55b of the ring 55 of the spin chuck 50 to lock the chuck body 51. At this stage, the peripheral part of the wafer W is held by the third holding parts 58c of the holding members 53 as shown in FIGS. 17A and 17B. The edge arm 60 is retracted into the edge arm housing 42, and the shutter 48 is closed. Then, the mechanical shutter 44 of the substrate cleaning unit 12 and the mechanical shutter 46 of the outer cup 41 are opened. The wafer carrying arm 19 of the main wafer conveyer 18 advances into the substrate cleaning unit 12, picks up the wafer W from the spin chuck 50, and carries out the wafer W from the substrate cleaning unit 12. The under plate 72 is shifted to the inoperative position and a space sufficient for the operation of the wafer carrying arm 19 is formed between the wafer W held by the spin chuck 50 and the main plate 72. Therefore, the wafer carrying arm 19 is able to carry the wafer W away from the spin chuck 50 without being obstructed.

Although the substrate processing system of the invention has been described as applied to removing a resist film formed on a semiconductor wafer and cleaning the wafer, it goes without saying that the substrate processing system of the present invention is applicable to an etching process and processing substrates other than the semiconductor wafer, such as LCD substrates.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A substrate processing system comprising:
   a substrate processing unit that performs a predetermined process to process a substrate; and
   an aligner that aligns a cut-away portion formed in a peripheral portion of the substrate to be processed by the substrate processing unit to a designated angle;
   wherein the aligner includes:
   a first support device adapted to hold a peripheral portion of a substrate, without holding a central portion of the substrate, in a horizontal posture at a first level;
   a first actuator adapted to rotate the first support device about a vertical axis;
   a sensor adapted to detect the cut-away portion of the substrate supported on the first support device;
   a second support device adapted to lift up the substrate supported on the first support device stopped at the predetermined angular position to a second level higher than the first level;
   a second actuator adapted to vertically move the second support device; and
   a controller configured to control operations of the first actuator for driving the first support device for rotation, configured to control the first actuator so that the first support device supporting the substrate is stopped at a predetermined angular position when the cut-away position is detected, and configured to control the second actuator to position the second support device at a level lower than the first support device so that the aligner receives the substrate to be aligned by using the first support device when the substrate to be aligned by the aligner is delivered to the aligner, and so that the substrate, having been aligned by the aligner and placed on the first support device, is removed from the aligner when the substrate having been aligned by the aligner leaves the aligner so as to be processed by the processing unit.

2. The substrate processing system according to claim 1, wherein the first support device is configured to be incapable of vertical movement, and the second support device is configured to be incapable of rotation.

3. The substrate processing system according to claim 1 further comprising:
   a receiving/delivering section adapted to receive the substrates to be processed by the substrate processing unit and to deliver the substrate processed by the substrate processing unit;
   a first substrate conveyer adapted to carry the substrate between the receiving/delivering section and the aligner; and
   a second substrate conveyer adapted to carry the substrate between the aligner and the substrate processing unit.

4. A substrate processing system comprising:
   a substrate processing unit that performs a predetermined process to process a substrate; and
   an aligner that aligns a cut-away portion formed in a peripheral portion of the substrate to be processed by the substrate processing unit to a designated angle;
   wherein the aligner includes:
   a first support device adapted to hold a substrate in a horizontal posture at a first level;
   a first actuator adapted to rotate the first support device about a vertical axis;
   a sensor adapted to detect the cut-away portion of the substrate supported on the first support device;
   a controller configured to control operations of the first actuator for driving the first support device for rotation, and to control the first actuator so that the first support device supporting the substrate is stopped at a predetermined angular position when the cut-away portion is detected;
   a second support device adapted to lift up the substrate supported on the first support device stopped at the predetermined angular position to a second level higher than the first level; and
   a second actuator adapted to vertically move the second support device, said system further comprising:
   a substrate conveyer adapted to carry the substrate, having been aligned by the aligner, from the aligner, the conveyer having a substrate carrying arm,
   wherein:
   the first support device is configured so that the substrate carrying arm of the substrate conveyer can move below the substrate supported by the first support device without colliding with the first support device when the first support device is in an angular position within a first angular range; and
   the controller is configured to control operations of the first and the second actuators so that the second support device rises to receive the substrate from the first support device, thereafter the first support device rotates to be in an angular position within the first angular range, and thereafter the second support device lowers to deliver the substrate to the first support device, if the first support device is in an angular position within a second angular range in which the substrate carrying arm of the substrate conveyer collides with the first support device when the substrate carrying arm moves below the substrate supported by the first support device.

5. The substrate processing system according to claim 4, wherein the angular position within the first angular range to which the first support device is positioned is a home position, to which the first support device is positioned when the first support device receives the substrate to be aligned.

6. The substrate processing system according to claim 4, wherein the controller is configured to control operations of the first and the second actuators so that the second support device rises to receive the substrate from the first support device, thereafter the first support device rotates to be in the angular position within the first angular range, and thereafter the second support device lowers to deliver the substrate to the first support device, only when the first support device is in the angular position within the second angular range.

7. A substrate processing system comprising:
   a substrate processing unit that performs a predetermined process to process a substrate; and
   an aligner that aligns a cut-away portion formed in a peripheral portion of the substrate to be processed by the substrate processing unit to a designated angle;
   wherein the aligner includes:
   a first support device adapted to hold a substrate in a horizontal posture at a first level;
   a first actuator adapted to rotate the first support device about a vertical axis;
   a sensor adapted to detect the cut-away portion of the substrate supported on the first support device;

a controller configured to control operations of the first actuator for driving the first support device for rotation, and to control the first actuator so that the first support device supporting the substrate is stopped at a predetermined angular position when the cut-away portion is detected;

a second support device adapted to lift up the substrate supported on the first support device stopped at the predetermined angular position to a second level higher than the first level; and a second actuator adapted to vertically move the second support device, wherein:

the sensor is an optical sensor having a light-emitting element and a light-receiving element, the light-emitting element being configured to vertically emit a light to a peripheral portion of the substrate supported on the first support device;

the first support device has a plurality of support elements that support peripheral portions of the substrate thereon; and each of the support elements is configured and sized so that the cut-away portion of the substrate does not entirely overlap with any one of the supporting elements, as viewed in a vertical direction.

8. A substrate processing system comprising:

a substrate processing unit that performs a predetermined process to process a substrate; and an aligner that aligns a cut-away portion formed in a peripheral portion of the substrate to be processed by the substrate processing unit to a designated angle;

wherein the aligner includes:

a first support device adapted to hold a substrate in a horizontal posture at a first level;

a first actuator adapted to rotate the first support device about a vertical axis;

a sensor adapted to detect the cut-away portion of the substrate supported on the first support device;

a controller configured to control operations of the first actuator for driving the first support device for rotation, and to control the first actuator so that the first support device supporting the substrate is stopped at a predetermined angular position when the cut-away portion is detected;

a second support device adapted to lift up the substrate supported on the first support device stopped at the predetermined angular position to a second level higher than the first level; and a second actuator adapted to vertically move the second support device, wherein:

the sensor is an optical sensor having a light-emitting element and a light-receiving element, the light-emitting element being configured to vertically emit a light to a peripheral portion of the substrate supported on the first support device; and the first support device includes a plurality of support arms each having a first portion extending radially outwardly, a second portion rising from an outer end of the first portion, and a third portion extending radially inwardly from an upper end of the second member and having a bifurcated end on which the substrate is to be placed, the bifurcated end of each of the support arms comprises a pair of support elements arranged so that a gap is defined therebetween, the first portion of the support arm has a through hole, and the gap and the thorough hole is are arranged and sized so that at least a part of the light emitted by the light-emitting element of the sensor is capable of passing through the through hole, the gap and the cut-away portion of the substrate, even if the substrate is supported on the first support member in such a manner that the cut-away portion of the substrate is located on or adjacent to the bifurcated end.

9. A substrate positioning method comprising the steps of:

(a) placing a substrate on a first support device, which is in a home angular position;

(b) detecting, after the step (a), a cut-away portion formed in a peripheral portion of the substrate while rotating the first support member together with the substrate supported thereon;

(c) stopping, after the step (b), rotating the first support member to align the cut-away portion of the substrate to a designated angle based on a detection of the cut-away portion;

(d) raising, after the step (c), a second support device to transfer the substrate from the first support device to the second support device;

(e) rotating, after the step (d), the first support device to rotate the first support device relative to the second support device and the substrate supported on the second support device, and to position the first support device in the home angular position;

(f) lowering, after the step (e), the second support device to transfer the substrate from the second support device to the first support device; and (g) removing, after the step (f), the substrate from the first support device by a substrate conveyer.

10. The method according to claim 9, wherein the step (a) is performed by a first substrate conveyer, and the step (g) is performed by a second substrate conveyer.

11. The method according to claim 10, wherein the substrate to be placed on the first support device in the step (a) is delivered from a receiving/delivering section of a substrate processing system, and the substrate removed from the first support device in the step (g) is conveyed to a processing unit of the substrate processing system.

12. A substrate positioning method comprising the steps of:

(a) placing a substrate on a first support device;

(b) detecting a cut-away portion formed in a peripheral portion of the substrate while rotating the first support member together with the substrate supported thereon;

(c) stopping rotating the substrate to align the cut-away portion of the substrate to a designated angle based on a detection of the cut-away portion;

(d) judging whether or not a substrate carrying arm of a substrate conveyer collide with the first support device, when the substrate carrying arm moves into a space below the substrate supported by the first support device;

(e) performing, if it is judged in the step (d) that the arm of the substrate conveyer does not collide with the first support device, the steps of:

(e-i) moving the arm of the substrate conveyer into the space below the substrate supported by the first support device; and (e-ii) raising the arm of the substrate conveyer to remove the substrate from the first support device; and (f) performing, if it is judged in the step (d) that the arm of the substrate conveyer collides with the first support device, the steps of:
- (f-i) raising a second support device to transfer the substrate from the first support device to the second support device;
- (f-ii) rotating the first support device to position the first support device in an angular position in which the first support device does not collide with the arm of the substrate conveyer;
- (f-iii) lowering the second support device to transfer the substrate from the second support device to the first support device;
- (f-iv) moving the arm of the substrate conveyer into the space below the substrate supported by the first support device; and
- (f-v) raising the arm of the substrate conveyer to remove the substrate from the first support device.

* * * * *